US006930381B1

(12) United States Patent
Cornelius

(10) Patent No.: US 6,930,381 B1
(45) Date of Patent: Aug. 16, 2005

(54) WIRE BONDING METHOD AND APPARATUS FOR INTEGRATED CIRCUIT

(75) Inventor: William P. Cornelius, Los Gatos, CA (US)

(73) Assignee: Apple Computer, Inc., Cupertino, CA (US)

( * ) Notice: Subject to any disclaimer, the term of this patent is extended or adjusted under 35 U.S.C. 154(b) by 118 days.

(21) Appl. No.: 10/121,167

(22) Filed: Apr. 12, 2002

(51) Int. Cl.[7] .................. H01L 23/498; H01L 21/60
(52) U.S. Cl. ....................... 257/692; 438/125
(58) Field of Search ................ 257/692, 693, 257/695, 698, 700, 738, 758, 784, 786, 678, 257/688; 438/106, 125

(56) References Cited

U.S. PATENT DOCUMENTS

| | | | |
|---|---|---|---|
| 5,637,920 A | | 6/1997 | Loo |
| 5,717,245 A | | 2/1998 | Pedder |
| 5,973,928 A | * | 10/1999 | Blasi et al. .................. 361/760 |
| 5,982,633 A | | 11/1999 | Jeansonne |
| 6,008,532 A | * | 12/1999 | Carichner .................... 257/691 |
| 6,057,596 A | * | 5/2000 | Lin et al. ..................... 257/697 |
| 6,064,113 A | * | 5/2000 | Kirkman ...................... 257/691 |
| 6,075,285 A | * | 6/2000 | Taylor et al. ................ 257/691 |
| 6,114,769 A | | 9/2000 | Thompson, Sr. |
| 6,235,997 B1 | | 5/2001 | Asada et al. |
| 6,414,386 B1 | * | 7/2002 | Beaulieu et al. ............ 257/691 |
| 6,448,639 B1 | * | 9/2002 | Ma .............................. 257/691 |
| 6,522,173 B1 | * | 2/2003 | Otsuka ........................ 326/101 |
| 6,538,336 B1 | * | 3/2003 | Secker et al. ............... 257/786 |
| 6,680,544 B2 | * | 1/2004 | Lu et al. ...................... 257/786 |

* cited by examiner

*Primary Examiner*—Erik Kielin
*Assistant Examiner*—Jennifer M Dolan
(74) *Attorney, Agent, or Firm*—Blakely, Sokoloff, Taylor & Zafman LLP

(57) ABSTRACT

Wire bonding methods and apparatuses are described herein. In one aspect of the invention, an exemplary apparatus includes a plurality of electrically conductive contacts disposed on a surface of the IC device, the plurality of electrically conductive contacts being disposed in at least two rows, a plurality of first return paths formed through some of the plurality of electrically conductive contacts, a plurality of signal paths formed through some of the plurality of electrically conductive contacts, and wherein at least one of the plurality of first return paths are placed between every predetermined number of the plurality of the signal paths. Other methods and apparatuses are also described.

33 Claims, 24 Drawing Sheets

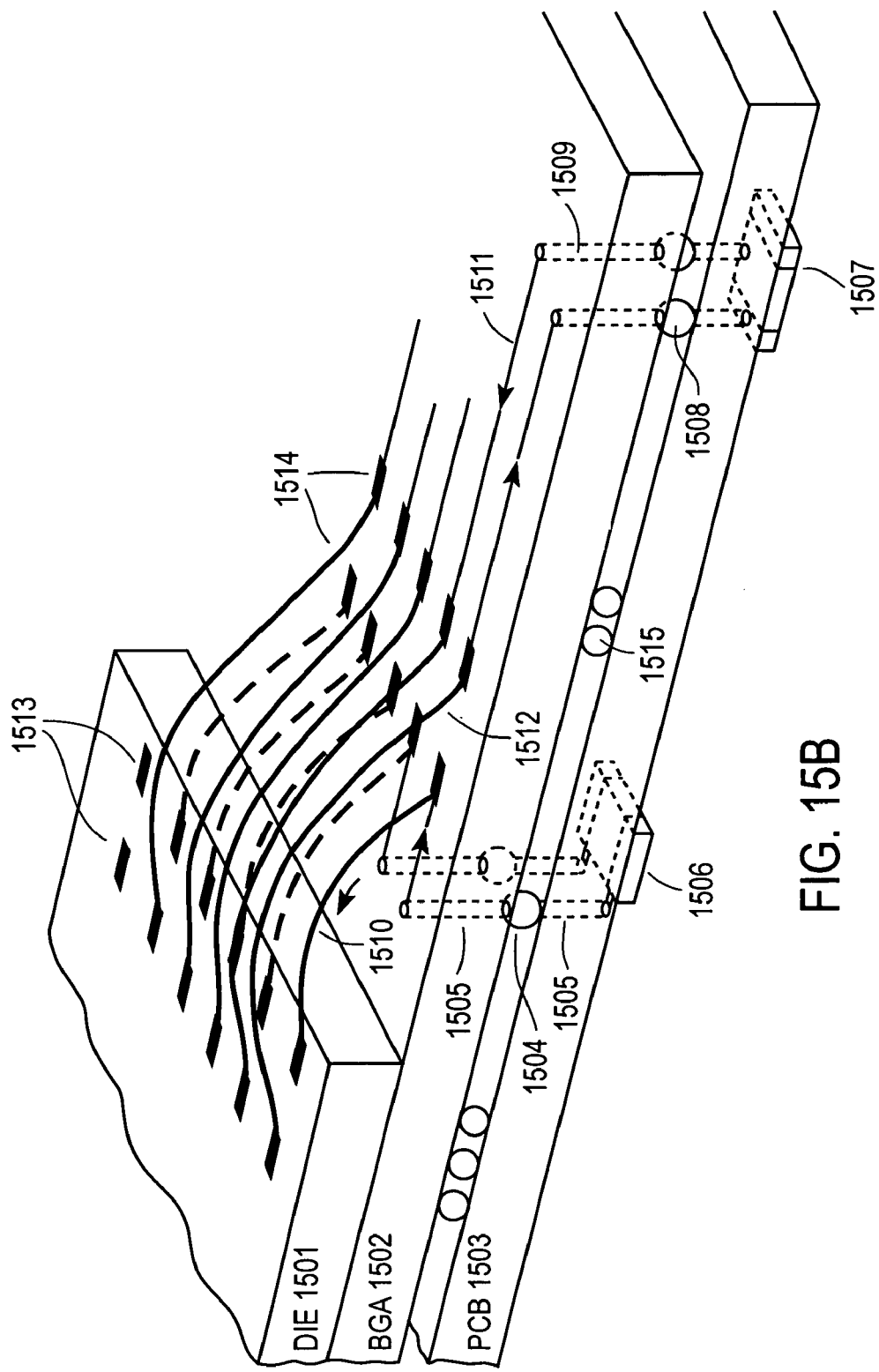

WIRE BONDING METHOD AND APPARATUS FOR INTEGRATED CIRCUIT

FIELD OF THE INVENTION

The present invention relates to packages for integrated circuits. More particularly, the present invention relates to package arrangement to reduce loop inductance.

BACKGROUND OF THE INVENTION

Presently used to make integrated circuits with printed circuit boards, ball grid arrays (BGA's) packages are leadless, surface-mounted packages in which solder balls interconnects cover the bottom surface of the package in a checkerboard fashion. Typically, a mass reflow process is used to attach BGA's to printed circuit boards (PCB's), a term generally used for printed circuit configurations such as rigid or flexible, single, double, or multilayered boards that are completely processed. Integrated circuit (IC) is the term generally used for a microelectronic semiconductor device consisting of many interconnected transistors and other components. Typically, IC's are fabricated on a small rectangle called a die that is cut from a silicon wafer known as a substrate. Different areas of the substrate are "doped" with other elements to make them either "p-type" or "n-type." Polysilicon or aluminum tracks are etched in one to three (or more) layers deposited over the substrate's surface(s). The die is then connected into a package using gold wires, which are welded to "pads," usually found near the edge of the die.

Ball grid arrays formed on multilayer substrates typically incorporate within the BGA substrate pattern drilled holes in laminate called vias, which connect different layers of circuitry. Typically, at least one via is positioned between two diagonal balls on the substrate, or on the printed circuit board (PCB).

Inductance is the ability of a conductor to produce an induced voltage when cut by a magnetic flux; A conductor is a material capable of conveying an electric current. Virtually all conductors have inductance, but the amount of inductance associated with each conductor varies according to a number of factors such as type of conductive material, shape of the conductor, length of the conductor, and so forth. For example, a shorter wire has less inductance than a long wire because less conductor length cut by a magnetic flux produces less voltage. Similarly, a straight wire has less inductance than a coiled wire because the conductor concentrates more conductor length in a given area of magnetic flux.

Induction (the production of an induced current within a conductor) occurs whenever magnetic flux cuts across a conductor, such as when a wire is moved within a stationary magnetic field, or when a magnetic field fluctuates about a fixed wire. One characteristic of inductors is that the faster the speed at which the flux changes, the more voltage is induced. The flux induces change in current. For example, Alternating current (AC) circuits continually produce an induced voltage because the current is continuously changing. The faster the current changes, the higher the induced voltage, which always opposes the change in voltage. If current increased, the polarity of the induced voltage opposes the increase in current, and vice versa. However, it is not necessary for the current to alternate directions. Inductance affects DC circuits transient responses whenever the value of the DC current changes, such as when a DC circuit is turned on and off. The switch induces a transient which is a change. The transient will settle to a new value according to the response of the network. Digital signaling is a sequence of transients. Further details concerning about inductance and simultaneous switching noise can be found in the book entitled *Digital Signal Integrity: Modeling and Simulation with Interconnects and Packages*, by Brian Young, published by Prentice Hall PTR.

Mutual inductance typically occurs whenever two conductors are positioned closely together such that a varying fluxes resulting from a change in current in Conductor A cuts across and induces voltage in Conductor B. This induced voltage, in turn, generates a magnetic flux that cuts across and induces a voltage in conductor A. Because a current in one conductor can induce voltage in the adjacent conductor, the conductors are said to have mutual inductance. To offset this appreciable effect, traces, leads, and current return path are usually kept as short as possible.

Each of these inductance discussed above seriously affects, and in some cases limits, the input/output (I/O) processing speeds of integrated circuits. For example, in the case where all the bus outputs of a circuit simultaneously switch the same way, there will be a current surge flowing in the circuit. This current surge generates an appreciable induced voltage in the circuit's conductors. The induced voltage generates a current flowing opposite to the wave of current, reduces the amount of current flowing through the circuit, thereby slowing the settling time current flow. It is clear that faster processing times will result if system inductance can be minimized. Thus it apparent to one with ordinary skill in the art that a better design is needed.

SUMMARY OF THE INVENTION

Accordingly, the present invention, in some embodiments, introduces unique methods and apparatuses for designing a package with reduced loop inductance. In one aspect of the invention, an exemplary apparatus includes Wire bonding methods and apparatuses are described herein. In one aspect of the invention, an exemplary apparatus includes a plurality of electrically conductive contacts disposed on a surface of the IC device, the plurality of electrically conductive contacts being disposed in at least two rows, a plurality of first return paths formed through some of the plurality of electrically conductive contacts, a plurality of signal paths formed through some of the plurality of electrically conductive contacts, and wherein at least one of the plurality of first return paths are placed between every predetermined number of the plurality of the signal paths.

In another aspect of the invention, an exemplary apparatus includes a multi-layer substrate having a top surface and a bottom surface, a device attachment area disposed centrally on the top surface, a plurality of bond attachment areas disposed peripherally around the device attachment area on the top surface, the bond attachment areas including a plurality of the electrically conductive contacts receiving bond wires from an integrated circuit (IC) device attached to the device attachment area, an outer ball region disposed peripherally along perimeter of the bottom surface, the outer ball region having a plurality of outer balls, a grid of electrically conductive balls disposed on the bottom surface, between the perimeter of the device attachment area and the outer ball region, a first grid of electrically conductive vias disposed between the perimeter of the device attachment area and the outer ball region, the first grid of electrically conductive vias connecting the top and bottom surfaces through the substrate, and a plurality of electrically conductive traces for forming electrical interconnections between the balls, the vias, and the electrically conductive contacts of the bond attachment areas.

In an alternative embodiment, the exemplary apparatus further includes a circuit board having a top surface and a bottom surface, the substrate being disposed on the top surface of the circuit board through the grid of electrical conductive balls disposed on the bottom surface of the substrate, a second grid of electrically conductive vias disposed through the circuit board to connect the top and bottom surfaces of the circuit board, and one or more capacitors disposed on the bottom surface of the circuit board, the one or more capacitors coupling one or more vias of the circuit board.

The present invention includes methods which form these apparatus. Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 15B illustrates yet another alternative embodiment of the invention.

DETAILED DESCRIPTION

The following description and drawings are illustrative of the invention and are not to be construed as limiting the invention. Numerous specific details are described to provide a thorough understanding of the present invention. However, in certain instances, well-known or conventional details are not described in order to not unnecessarily obscure the present invention in detail.

Figure 1:
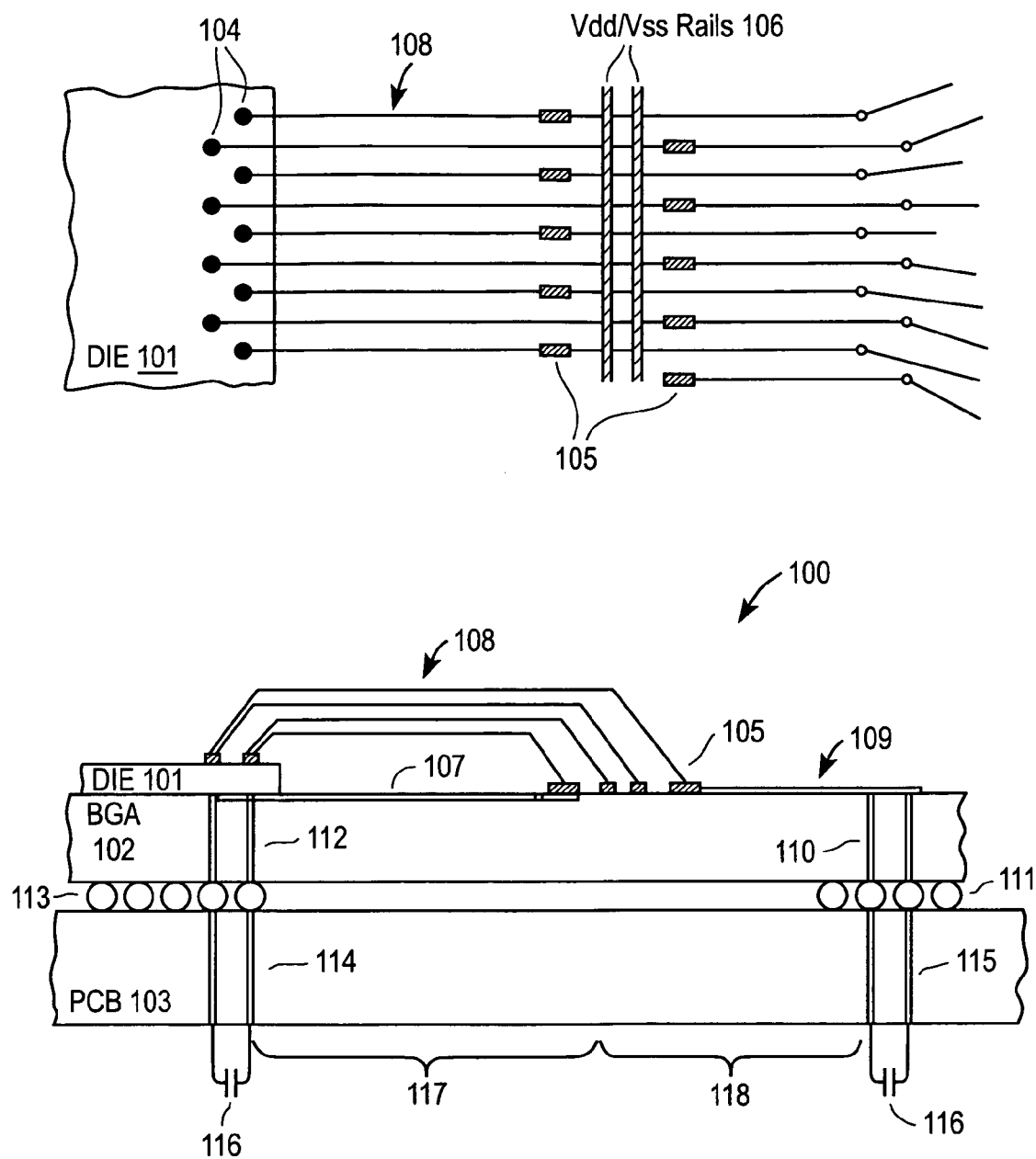
FIG. 1 illustrates a conventional integrated circuit package interconnect.

FIG. 1 illustrates a typical electronic package in the art. The package 100 includes an integrated circuit (IC) chip, also called die 101. The die 101 is attached on a ball grid array (BGA) substrate 102, which is mounted on a circuit board, such as printed circuit board (PCB) 103. Die 101 normally contains a plurality of electrically conductive contacts, called die pads 104 on the top surface of the die 101. BGA substrate 102 includes a plurality of electrically conductive contacts, also known as bond pads 105. Bond pads 105 receive the bond wires 108 attached to the die pads 104. Electrically conductive traces 107 and 109 connect bond pads 105 to components in other areas or other layers, such as by-pass capacitors 116 mounted on the PCB 103. The BGA substrate is mounted on the PCB through a grid array of solder balls, such as solder balls 113 and 111. The components on different layers are connected through a grid of vias, such as vias 110, 112, 114, and 115. In this conventional package, a return path has to be picked up through either through vias 110 and 115, and solder balls 111, or the return path has to be formed through vias 112 and 114, and solder balls 113. Typical distance between the core balls 113 and the bond pads 105 may be approximately 2000 micron, and typical distance between the perimeter balls 111 and the bond pads 105 may be approximately 3000 micron. As a result, the return path is formed through a relatively large loop. These long loops have significant loop inductance.

Figure 2:
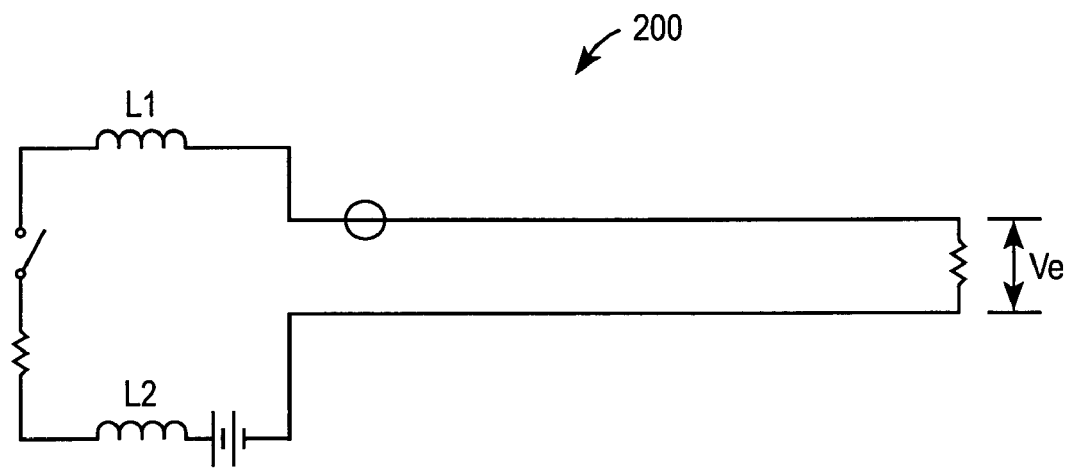
FIG. 2 illustrates a simplified electrical model of a loop inductance and the voltage induced effect due to the loop inductance.
Figure 2:
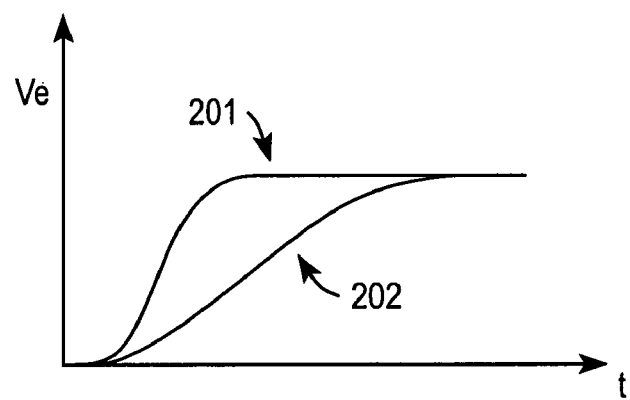

FIG. 2 illustrates an electrical model of a loop inductance. When a signal switches from zero volts to Ve, because of the long loop 200, the looping inductance causes Ve to be switched 202 significantly slower than expected 201. As a result, the looping inductance reduces the switching speed of an IC device.

Figure 3:
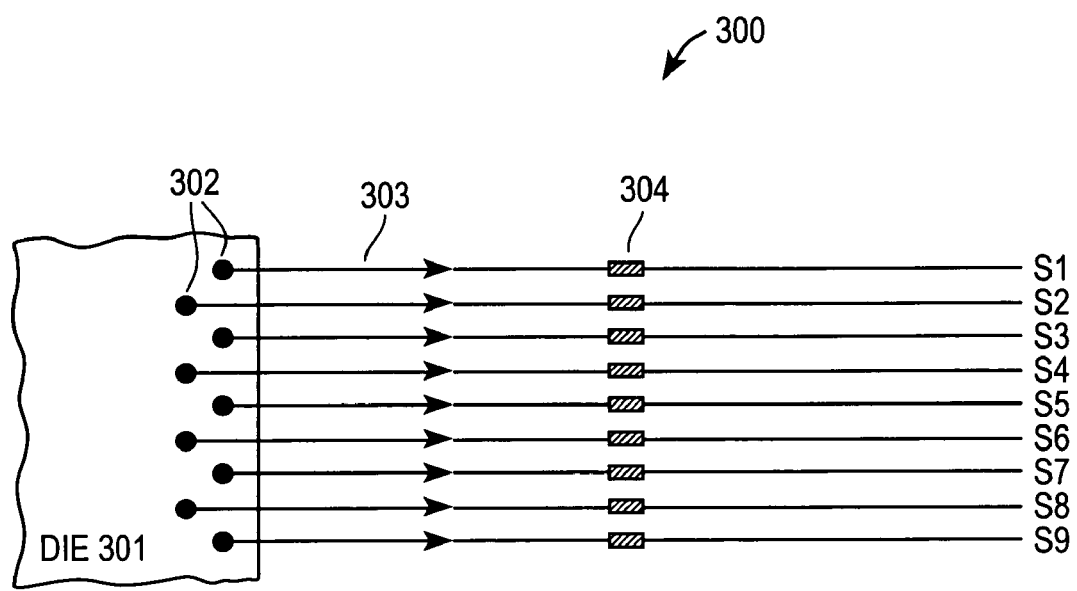
FIG. 3 illustrates another conventional integrated circuit structure.

FIG. 3 illustrates a typical signal paths in a conventional bonding method. As described in FIG. 3, signal paths 303 are wired from die pads 302 of a die 301 and the bond wires 303 are attached to bond pads 304 of a BGA substrate, forming signals $S_1$ to $S_9$, etc. If these signals are transmitted on the same direction, when they switch, the mutual inductance in the package is significant. Typically voltage resulting from the mutual inductance may be illustrated as follows:

$$V = L\frac{di_1}{dt} + M_{12}\frac{di_2}{dt} + \ldots + M_{19}\frac{di_9}{dt}$$

Wherein L is the self inductance of signal $S_1$, and $M_{1x}$ is the mutual inductance between the signal $S_1$ and signal $S_x$. As a result, the voltage resulting from the mutual inductance could be significant, because all mutual inductances are additive and have the same sign as the self inductance. This raises the effective inductance for a given signal, for example, in some cases, by as much as five to ten times.

Figure 4:
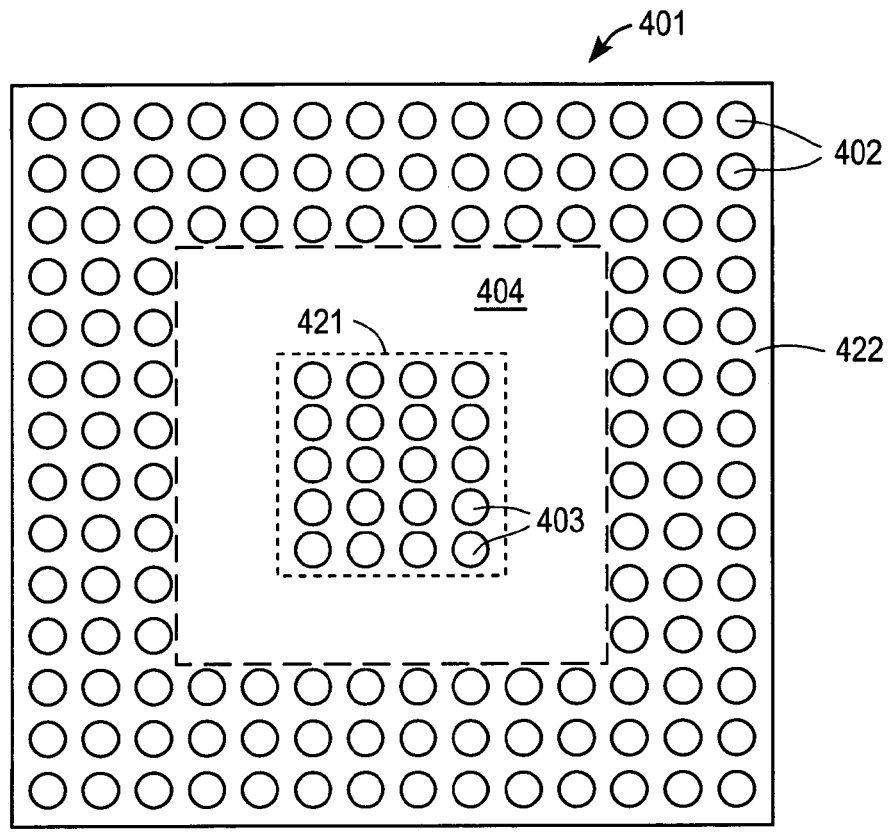
FIG. 4 illustrates yet another conventional integrated circuit structure.
Figure 4:
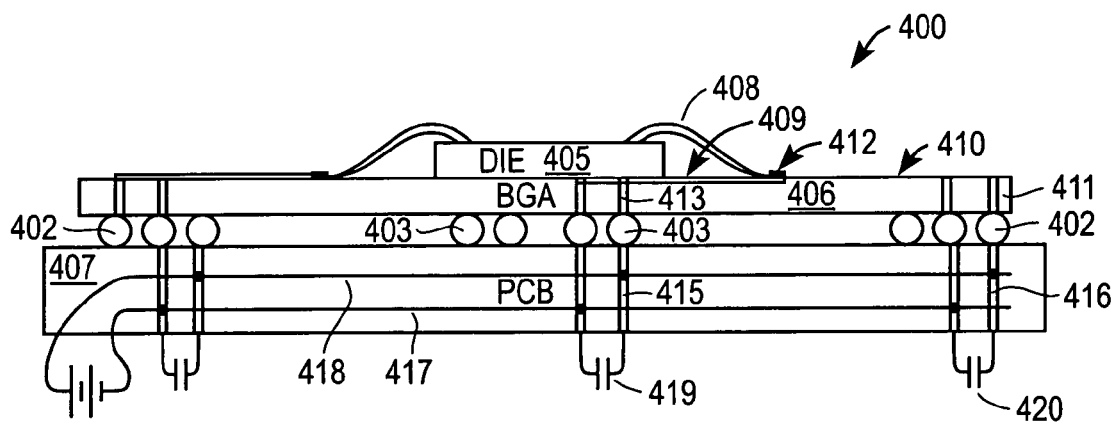

FIG. 4 illustrates another typical electronic package in the art. FIG. 4 includes a bottom view 401 of BGA substrate 406. As described in FIG. 4, conventional solder balls are placed either directly under and within the die 405 area, called core balls 403, or placed outside of the bond attachment area (e.g., bond wire wedge area), such was area 404, called perimeter balls 402 or the outer balls. The area where the outer balls 402 are placed is called outer ball region. The area 404 between the core balls 403 and the perimeter balls 402 normally is a ball free zone. The area 404 is normally used to attach the bond wires from the die 405 mounted on the device attachment area 421. Connections between the die 405 and the BGA substrate 406 are formed through bond wires 408 attached on the bond pads 412 located in the bond attachment area 404. The return paths have to be formed either using core balls 403 through vias 413, or using perimeter balls 402 through vias 411, to connect with other components on the other side of the PCB 407, such as by pass capacitors 419 and 420. As a result, a large loop inductance has been created.

Figure 5:
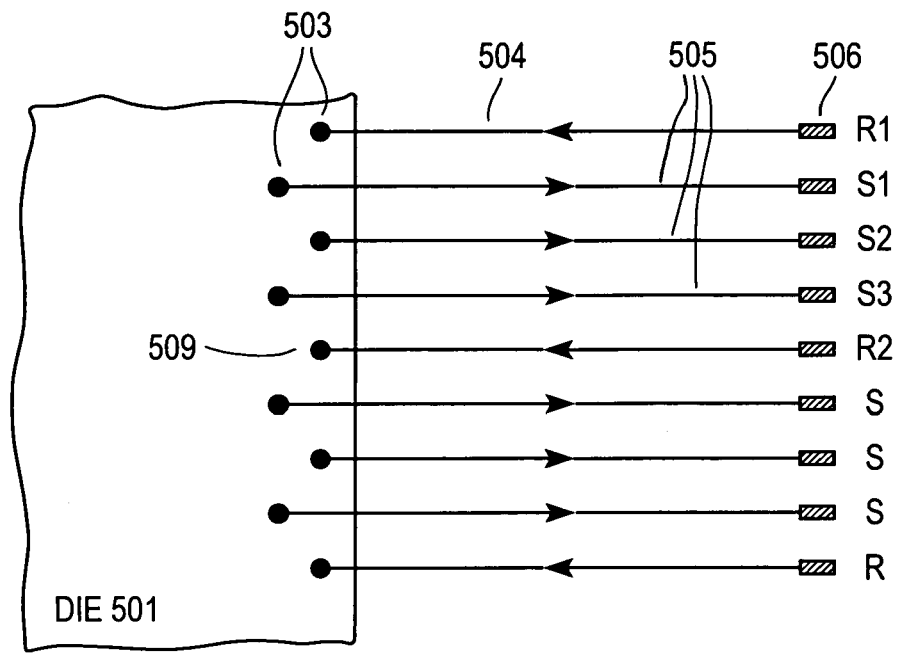
FIG. 5 illustrates an embodiment of the invention.
Figure 5:
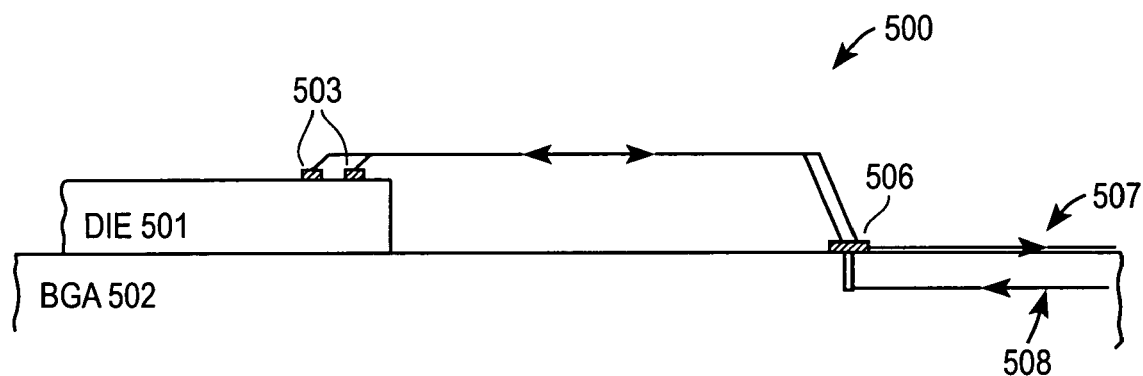

FIG. 5 illustrates an exemplary embodiment of the present invention. In one embodiment, the structure includes a plurality of electrically conductive contacts disposed on a surface of the IC device, plurality of electrically conductive contacts being disposed in at least two rows, a plurality of first return paths formed through some of the plurality of electrically conductive contacts, a plurality of signal paths formed through some of the plurality of electrically conductive contacts, and wherein at least one of the plurality of first return paths are placed between every predetermined number of the plurality of the signal paths.

Referring to FIG. 5, the bond wires connect between the die pads 503 of the die 501 and the bond pads 506 of the BGA substrate 502. The bond wires are configured such that signal paths are mixed with return paths. Referring to FIG. 5, signal paths 505 are mixed with return paths 504 and 509. Return paths 504 and 509 may be the same type of return path. Alternatively, return paths 504 and 509 may be different types of return paths. For example, return path 504 may be a Vdd path and return path 509 may be Vss path. Preferably a signal path is placed adjacent to a return path. In one embodiment, every certain signal paths are placed between two return paths. In a preferred embodiment, every three signal paths, such as S1, S2, and S3, are placed between return paths R1 and R2. Since the directions of the signal and return paths are opposite, the voltage induced by the mutual inductance terms, that couple the return paths current, have a sign that cancels with the self inductance term reducing the overall inductive voltage drop. In one embodiment, the electrical conductive contacts, such as die pads 503 and bond pads 506, are disposed in at least two rows. It would appreciated that multiple rows may be disposed.

In addition, according to one embodiment, the signal paths and return paths may be arranged in multiple heights, such that the mutual inductance may be cancelled in both horizontal and vertical direction (e.g., in a three dimensional (3D) pattern). For example, signal path 507, which runs on the top surface of the BGA substrate 502, may cancel the mutual inductance generated by the return path 508, which is laid inside the BGA substrate 502. Further, the signal path 507 may further cancel other mutual inductance induced from other return paths on the top surface of the BGA substrate 502, as well as those embedded inside the BGA substrate 502, similar to the return path 508. As a result, the mutual inductance is cancelled in a 3D pattern.

Although there is one layer shown inside the BGA substrate 502 in FIG. 5, it would be appreciated that multiple layers of signal and return paths may be laid inside the BGA substrate 502, as well as inside the PCB (not shown) on which the BGA substrate 502 is disposed. Such multiple layers of mixed signal and return paths constitute a 3D mixed signal and return paths structure. Such 3D mixed signal and return paths structure further improves the cancellation of the mutual inductance. In a further embodiment, a power plane and a ground plane may be embedded inside the BGA substrate 502 and the corresponding PCB (not shown) to mix with the signal and return paths.

The voltage induced from the mutual inductance may be illustrated as follows:

$$V = L\frac{di_1}{dt} + M_{12}\frac{di_2}{dt} + M_{13}\frac{di_3}{dt} - M_{1R}\frac{di_R}{dt}$$

Wherein the L is self inductance of the signal $S_1$, $M_{1x}$ is mutual inductance between signal $S_1$ and $S_x$. $M_{1R}$ is the mutual inductance between $S_1$ and the corresponding return path. The voltage induced by the return path will substantially cancel the additive terms due to other signal lines. Thus the effective inductance resulting from the loop has been significantly reduced.

Figure 6:
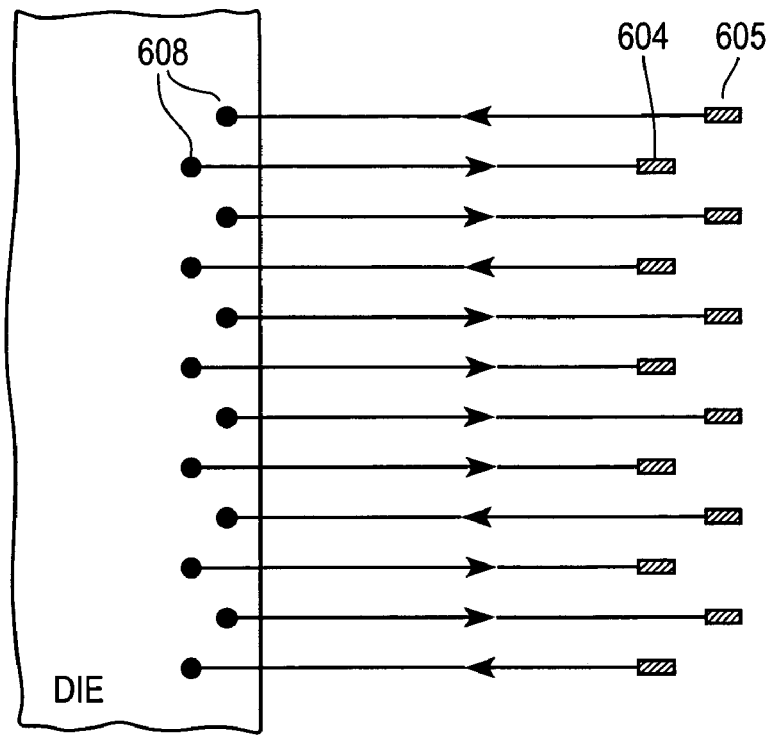
FIG. 6 illustrates an alternative embodiment of the invention.
Figure 6:
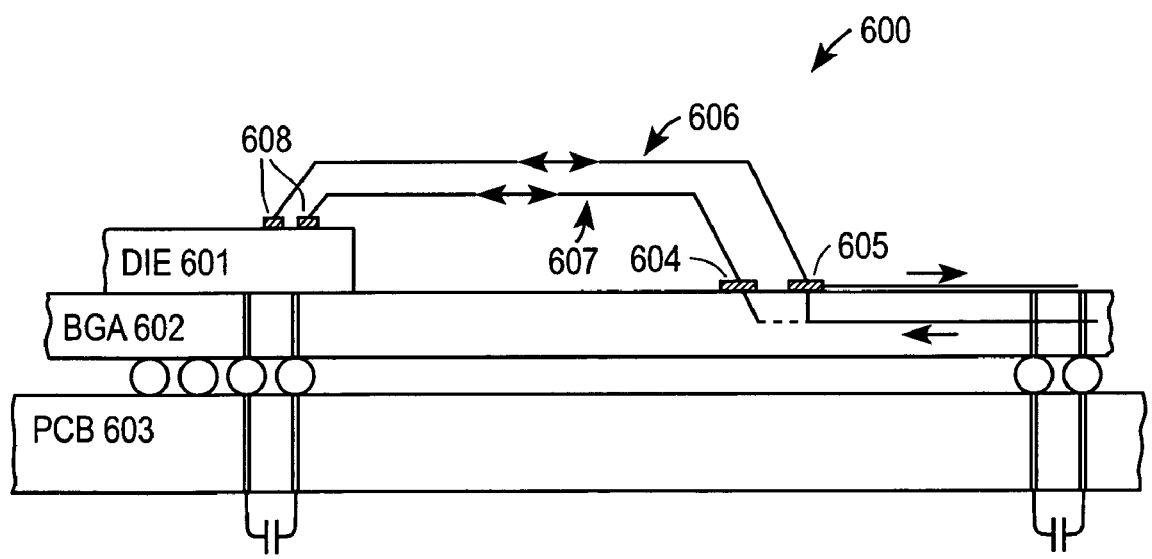

The loop inductance may be further reduced by an arrangement of bond pads illustrated in FIG. 6. As illustrated in FIG. 6, the bond pads are arranged in multiple rows, wherein the signal paths are mixed with return paths. In one embodiment, the bond wires are arranged in multiple heights (e.g., multiple levels in vertical direction, some bond wires are formed above the others) to form a 3D structure. For example, bond wires 606 are formed above the bond wires 607. Both bond wires 606 and 607 may include both signal paths and return paths. As a result, the loop inductance may be cancelled in a three dimensional pattern. Furthermore, as discussed above, similar 3D structure may be embedded inside the BGA substrate 602 and the PCB 603, to form another 3D mixed signal and return path structure inside the BGA substrate 602 and the PCB 603. As a result, mutual inductance of the conductors inside the BGA substrate 602 and the PCB 603 may be cancelled in a 3D pattern. In one embodiment, the electrical conductive contacts, such as die pads 608 and bond pads 604 and 605, are disposed in at least two rows. It would appreciated that multiple rows may be disposed.

Figure 7:
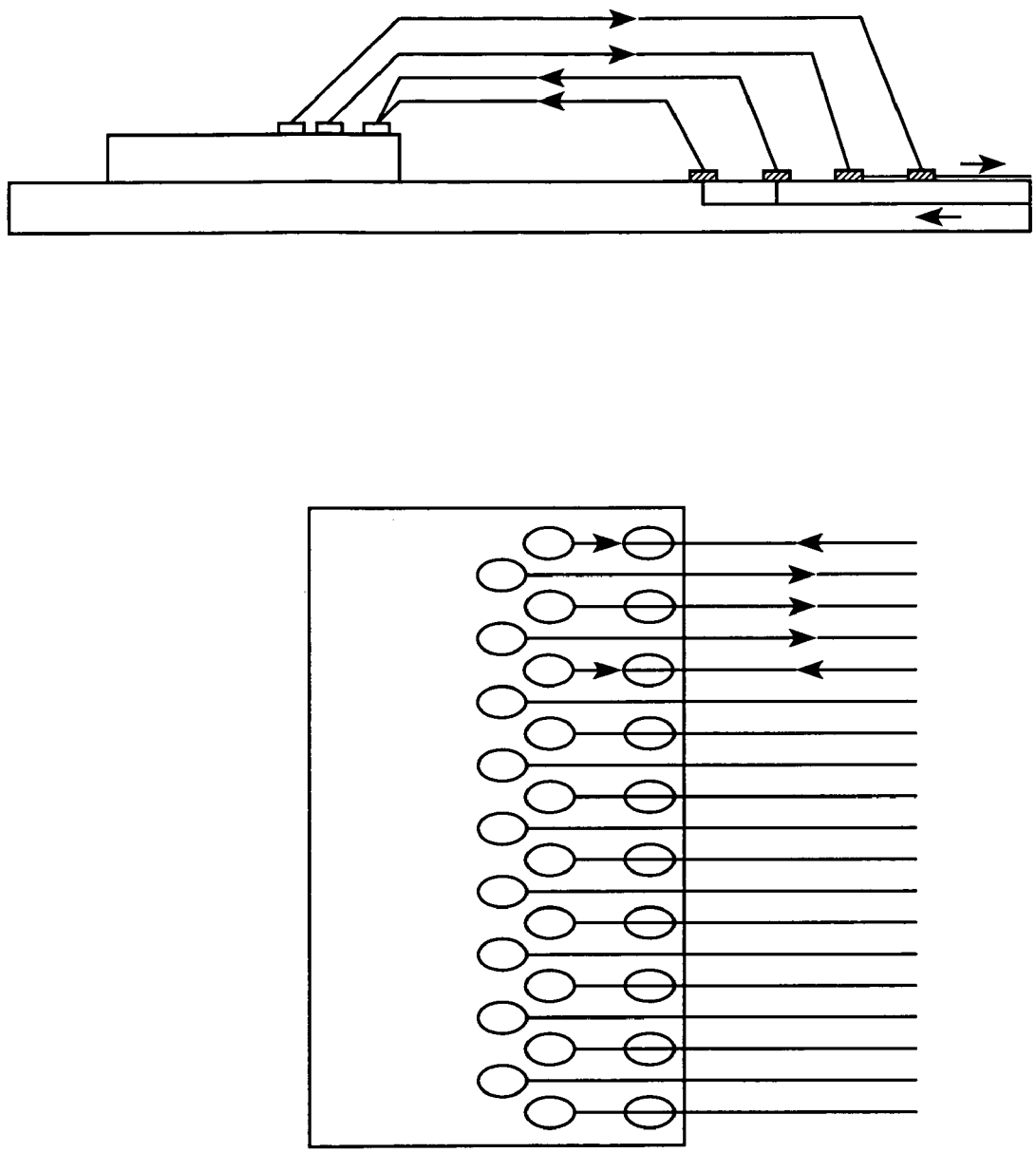
FIG. 7 illustrates another alternative embodiment of the invention.

FIG. 7 illustrates an alternative embodiment of the present invention. As the density of a package is getting high, the die pads on a die may include multiple rows of die pads. In one embodiment, outer row includes signal and return paths (e.g., power and ground signals), and the inner rows include signal paths. The signal paths are mixed with return paths in a pattern similar to those in FIGS. 5 and 6. In one embodiment, the electrical conductive contacts, such as die pads disposed on the die and bond pads disposed on the BGA substrate, are disposed in at least two rows. Alternatively, multiple rows may be disposed. In addition, in one embodiment, the bond wires connecting the die pads and the bond pads may be construed in multiple heights.

Figure 8:
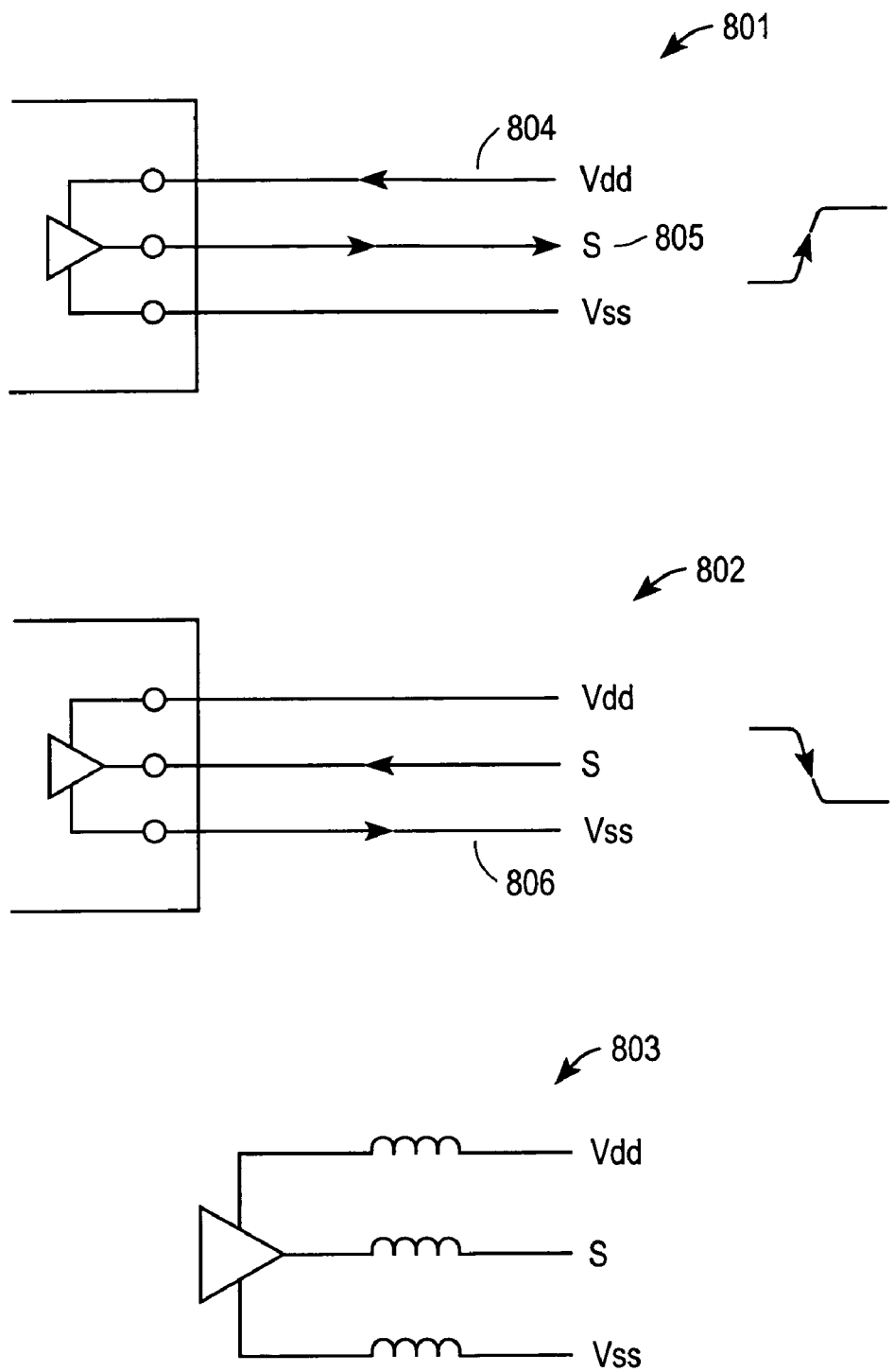
FIG. 8 illustrates an electrical model of an conventional method.

FIG. 8 illustrates an electrical model of a conventional IC wire bonding structure. When a signal switches from a low state (e.g., zero volts) to a high state (e.g., 2.1 volts), in the case of 801, Vdd 804 is utilized as return path. On the other hand, when a signal switches from a high state to a low state, Vss 806 is used as return path. As a result, only one return path (e.g., either Vdd or Vss) is used. Loop inductance may be further reduced when both Vdd and Vss return paths are used. As described earlier, loop inductance occurs when a signal switches in a signal path.

Figure 9:
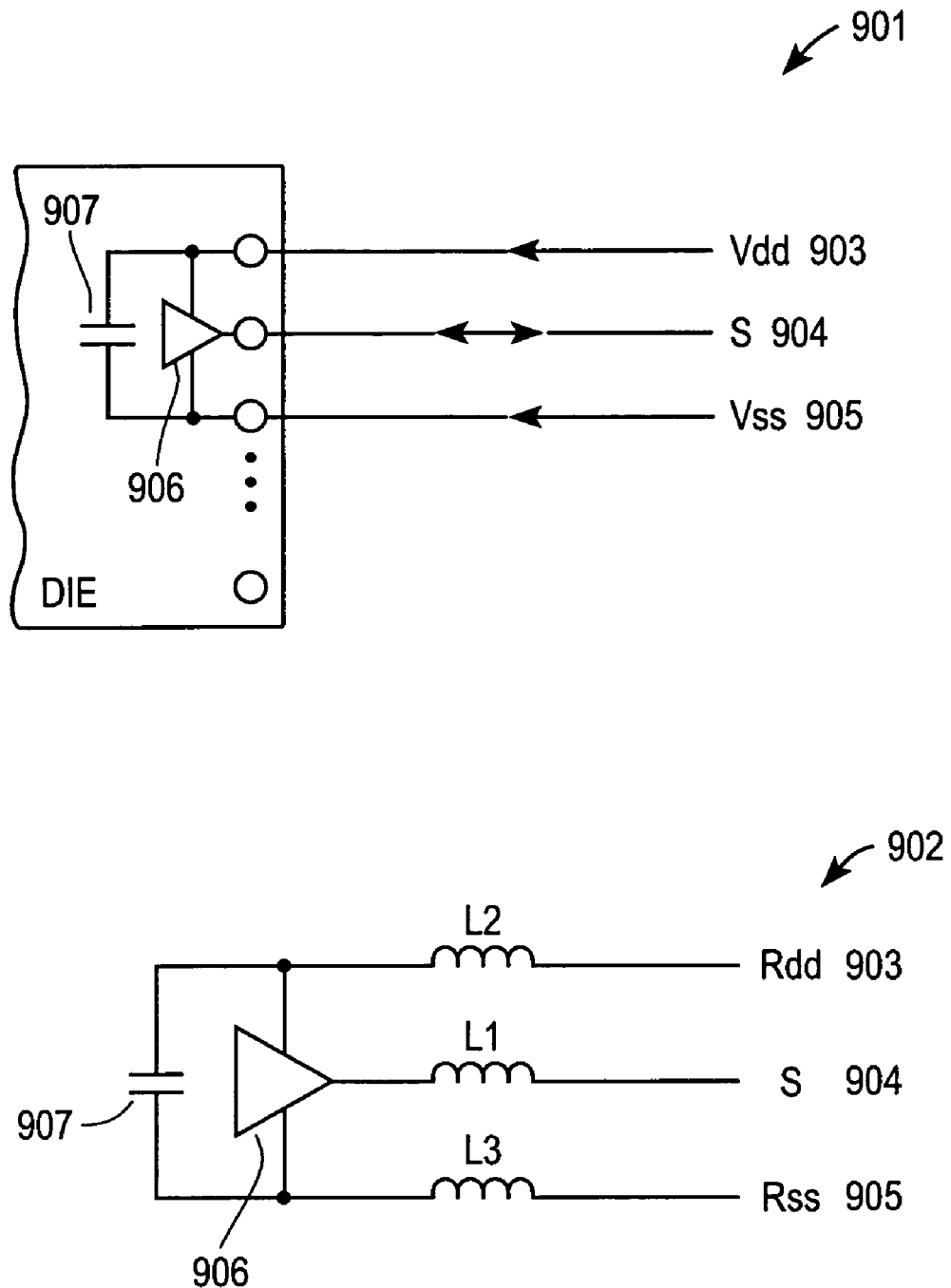
FIG. 9 illustrates yet another alternative embodiment of the invention.

FIG. 9 illustrates an embodiment of the present invention. In this embodiment, an alternating current (AC) capacitance device 907 is coupled to both Vdd return path 903 and Vss return path 905, on a driver 906 driving the signal 904. When the signal 904 switches from one state to another, the AC capacitance device 907 causes an instance shortage across the Vdd and Vss return paths. As a result, both Vdd and Vss can be used as return paths by the signal 904. Thus, self inductance $L_1$ of signal 904 may be reduced by the mutual inductance $M_{12}$ and $M_{13}$ from the return paths Vdd and Vss. Overall effective inductance may be reduced consequently. The voltage induced from the loop inductance may be illustrated as follows:

$$V = L_1 \frac{di_s}{dt} - M_{12} \frac{di_{Rdd}}{dt} - M_{13} \frac{di_{Rss}}{dt}$$

Where the $L_1$ is self inductance of signal 904, $M_{12}$ and $M_{13}$ are the mutual inductance between the signal path and the return paths Vss and Vdd respectively. In one embodiment, the AC capacitance device 907 may be a capacitor. Other capacitance devices may be utilized.

Figure 10:
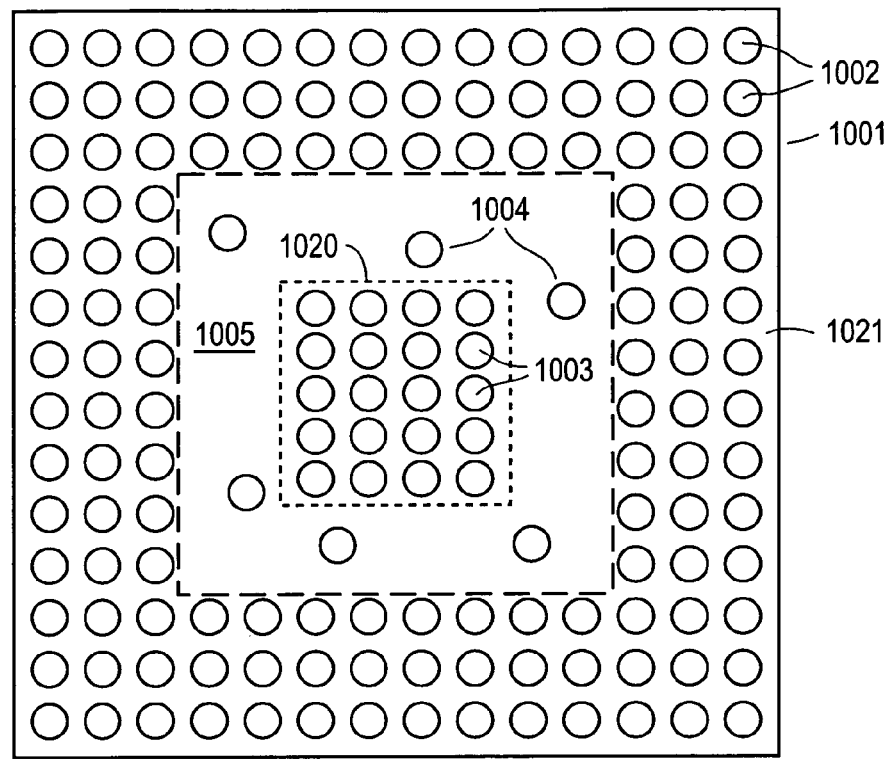
FIG. 10 illustrates yet another alternative embodiment of the invention.
Figure 10:
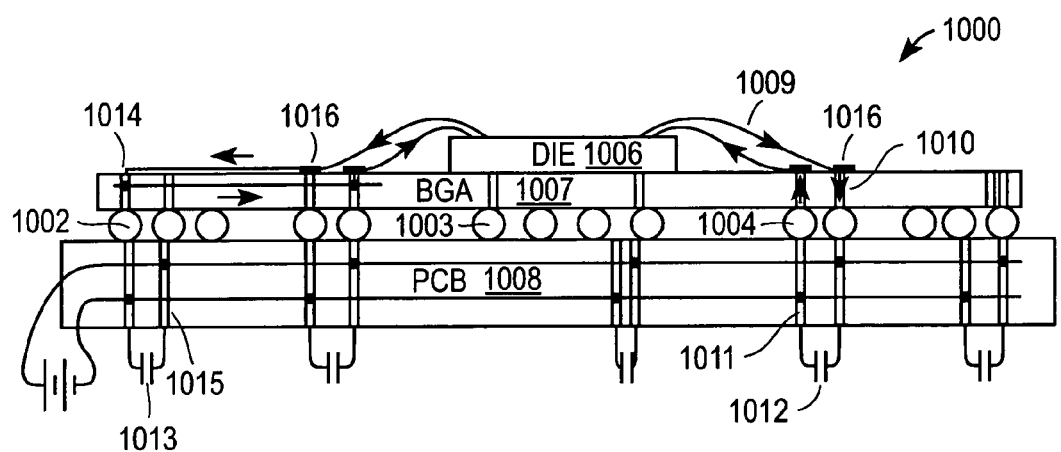

FIG. 10 illustrates yet another exemplary aspect of the present invention. The electronic package includes a multi-layer substrate having a top surface and a bottom surface, a device attachment area disposed centrally on the top surface, a plurality of bond attachment areas disposed peripherally around the device attachment area on the top surface, the bond attachment areas including a plurality of the electrically conductive contacts receiving bond wires from an integrated circuit (IC) device attached to the device attachment area, a grid of electrically conductive balls disposed on the bottom surface, between the perimeter of the device attachment area (e.g., area 1020) and the bond attachment areas (e.g., area 1004), a first grid of electrically conductive vias disposed between the perimeter of the device attachment area and the bond attachment areas, the first grid of electrically conductive vias connecting the top and bottom surfaces through the substrate, and a plurality of electrically conductive traces for forming electrical interconnections between the balls, the vias, and the electrically conductive contacts of the bond attachment areas.

Referring FIG. 10, in this embodiment, a bottom view 1001 of BGA substrate 1007 is shown. As described in FIG. 10, additional balls 1004 are placed between the core balls 1003 and the perimeter balls 1002, also as known as free ball zone 404, or the bond attachment area of FIG. 4, in a conventional design. Specifically, additional balls 1004 are placed between the perimeter of the device attachment area (e.g., the area 1020 where the die 1006 is disposed), and the outer balls region 1021 (e.g., the area where balls 1002 are placed). The additional balls 1004 are placed near the bond pads 1016 receiving the bond wires 1009 from the die 1006. The balls 1004 enable the bond wire connection reaches other components, such as by pass capacitor 1012 on the other side of the PCB 1008. As a result, the connection has much shorter loop and the loop inductance has been greatly reduced. Current flow is illustrated by arrowed lines that form a closed loop. Without the additional balls 1004, a conventional connection must go through the perimeter balls 1002 and their associated bias 1014 and 1015 to connect to other components such as capacitor 1013, which contains much longer loop and loop inductance. In one embodiment, the electrical conductive contacts, such as die pads disposed on the die and bond pads disposed on the BGA substrate, are disposed in at least two rows. Alternatively, multiple rows may be disposed. In addition, in one embodiment, the bond wires connecting the die pads and the bond pads may be construed in multiple heights.

Figure 11:
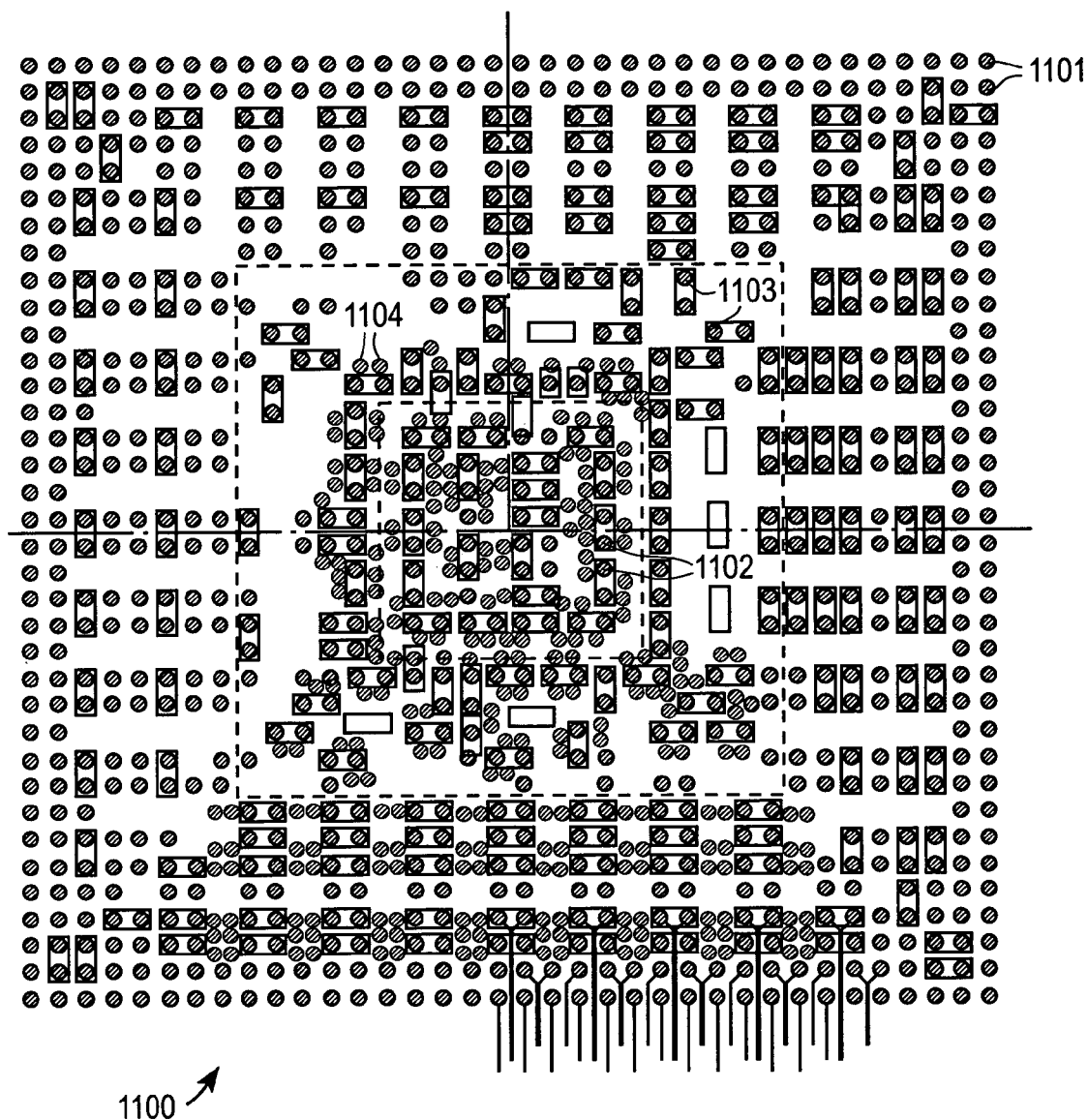
FIG. 11 illustrates a preferred embodiment of the invention.

FIG. 11 shows a bottom view of a preferred embodiment of the present invention. The package 1100 includes conventional perimeter balls 1101 and core balls 1102 within the die edges. In addition, the package 1100 includes additional balls 1103 and vias 1104 between the perimeter balls 1101 and the core balls 1102, so called free ball zone. These balls 1103 and vias 1104 enable the bond wires to connect to other components such as by pass capacitor 1012 of FIG. 10, in a much shorter loop. As a result, the loop inductance can be maintained at a lower level.

Figure 12:
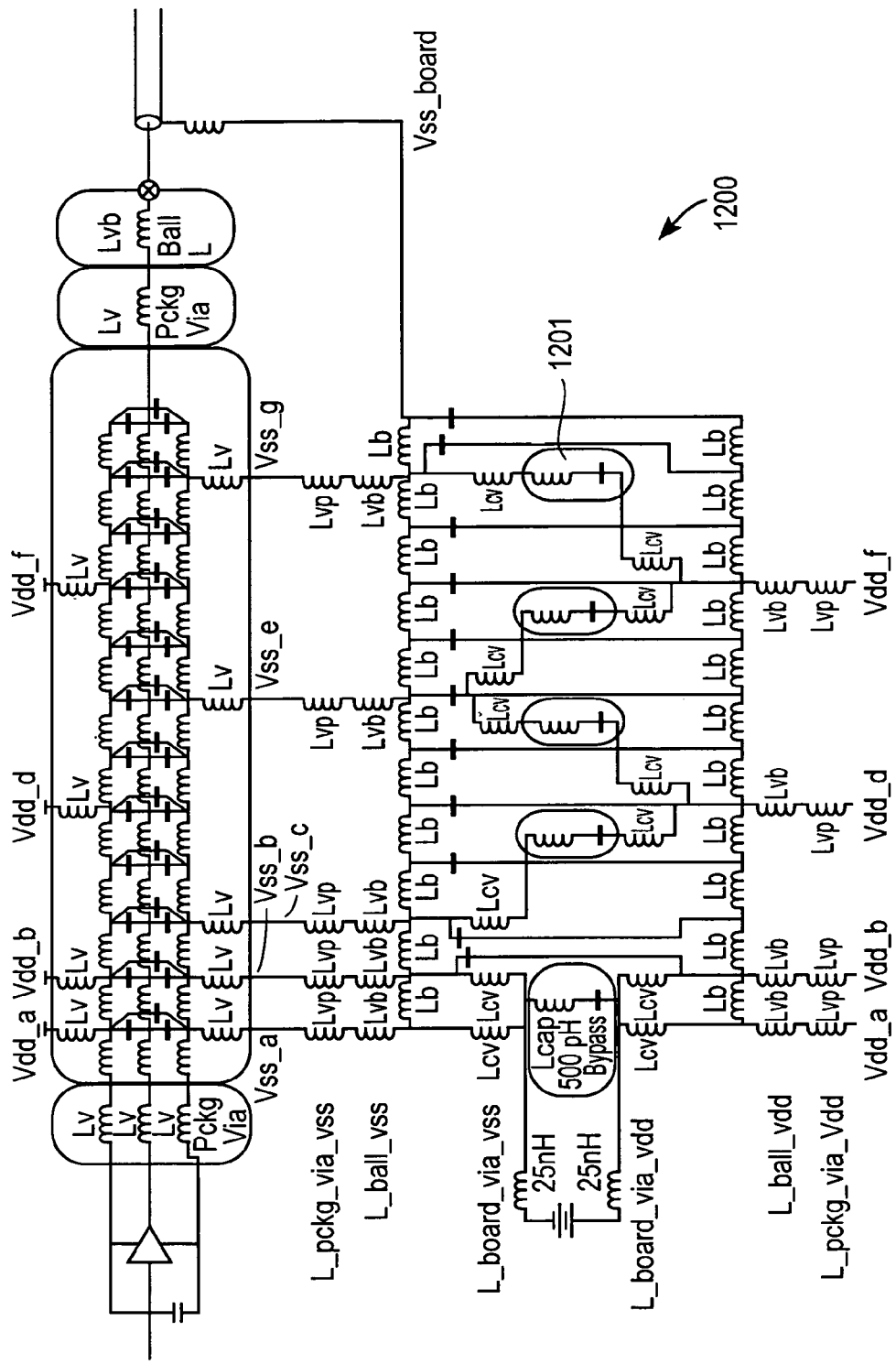
FIG. 12 illustrates an electrical model of an embodiment of the invention.

FIG. 12 shows an electrical model of inductance distribution according to one embodiment of the invention, where Lvb indicates a ball inductance, Lcv illustrates via inductance in the PCB board. The inductance L in the shaded region, such as region 1201 indicates the capacitors intrinsic inductance, and where Lvp illustrates via inductance in the package substrate.

Figure 13A:
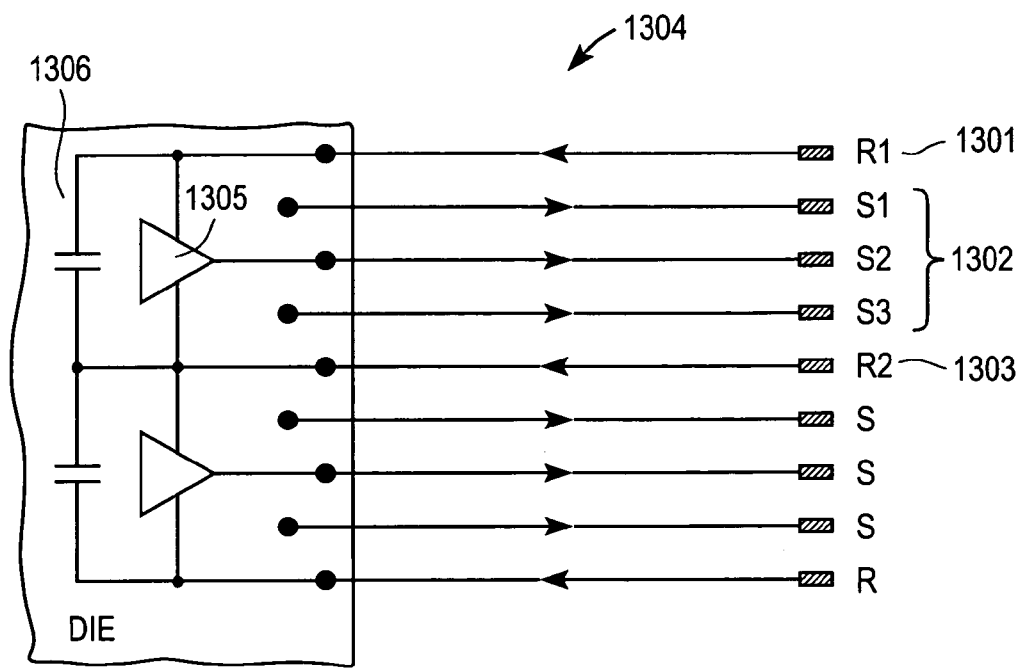
FIG. 13A illustrates yet another alternative embodiment of the invention.
Figure 13A:
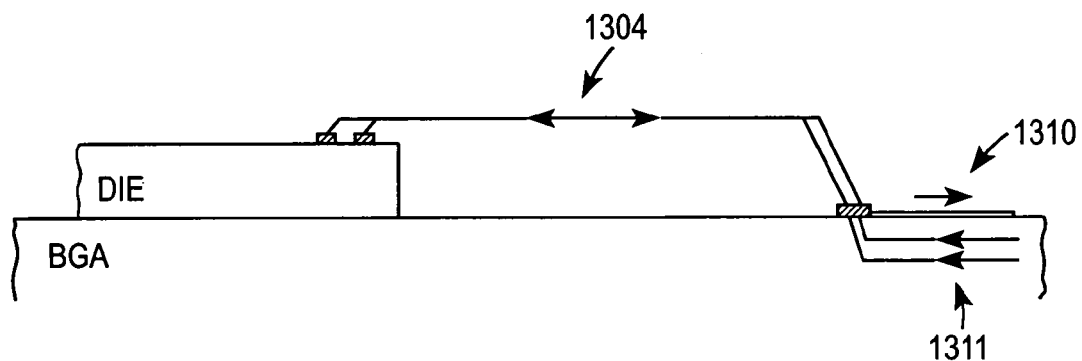

FIG. 13A shows an alternative embodiment of the invention. In this embodiment, the signal paths and return paths are construed that there is a return path between every certain number of signal paths. In one embodiment, a return path is placed between every three signal paths. Referring to FIG. 13A, signal paths 1302 are placed between return paths 1301 and 1303. Return paths 1301 and 1303 may be the same type of return paths. Alternatively, return paths 1301 and 1303 may be different type of return paths. In one embodiment, return path 1301 may be a Vdd path and return path 1303 may be a Vss path. In case of both return paths 1301 and 1303 are the same type of return path, the signal paths 1302 (e.g., including S1, S2, and S3) may utilize both return paths 1301 and 1303 as return paths. As a result, the signal paths and return paths are formed in very tight loop. Since the directions of the return paths and signal paths are opposite, the loop inductance will be reduced by the mutual inductance between signal and return paths. Thus the loop inductance may be maintained at an acceptable level.

When both return paths 1301 and 1303 are different (e.g., Vdd and Vss return paths), an AC capacitance device 1306 is coupled to both return paths 1301 and 1303. Because of the AC characteristics of the AC capacitance device 1306, when a signal in the signal paths 1302 switches from one state to another, the AC capacitance device 1306 instantaneously provides shortage over both return paths. As a result, both return paths may be used by the signal paths 1302. For the same reasons above, the loop inductance may be reduced.

In addition, in one embodiment, signals, such as signals 1310 may run on a surface of the BGA substrate and the return paths may run underneath the surface. The return paths may be construed as multiple layers planes inside the substrate. As described in FIG. 13A, the signal paths 1310 and return paths 1311 are laid out very closely to minimize the loop (e.g., loop inductance). In one embodiment, the electrical conductive contacts, such as die pads disposed on the die and bond pads disposed on the BGA substrate, are disposed in at least two rows. Alternatively, multiple rows may be disposed. In addition, in one embodiment, the bond wires connecting the die pads and the bond pads may be construed in multiple heights.

Figure 13B:
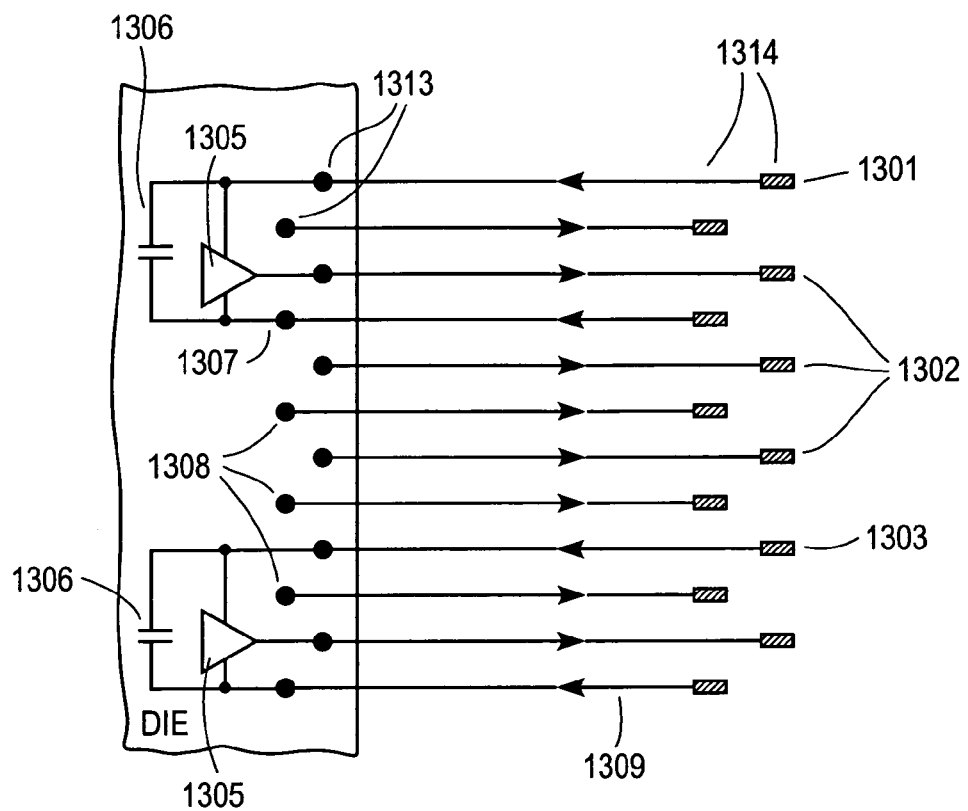
FIG. 13B illustrates yet another alternative embodiment of the invention.
Figure 13B:
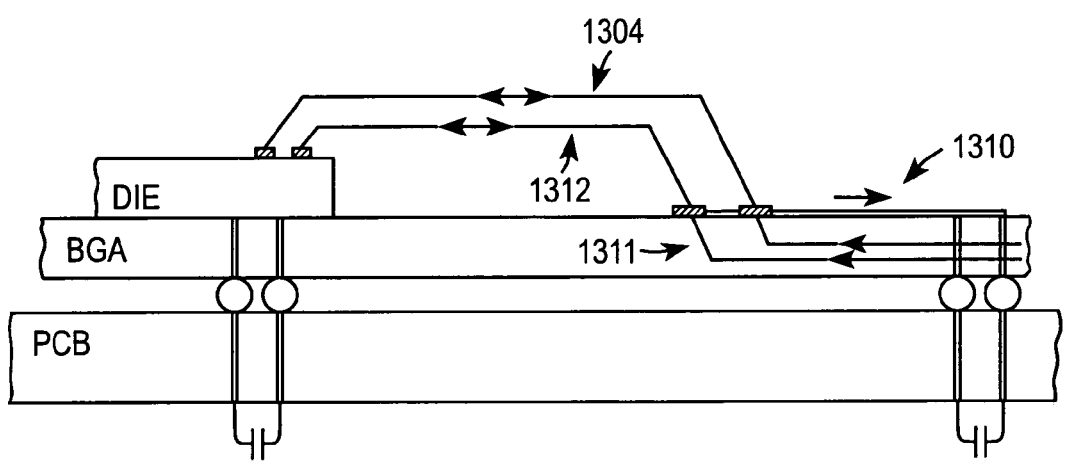

FIG. 13B shows yet another alternative embodiment. In this embodiment, the bond pads are laid out in multiple rows. Each row includes a pattern that a return path is placed between every certain number of signal paths. In one embodiment, a return path is placed between every three signal paths. For example, signal paths 1302 are placed between return paths 1301 and 1303 on one row, and signal paths 1308 are placed between return paths 1307 and 1309 on the other row. It would be appreciated that multiple rows are placed in a mixed patter such that no more than one return path is placed adjacent to each other. In one embodiment, the return paths may be the same type of return path. Alternatively, the return paths may include Vdd and Vss return paths. In case of Vdd and Vss return paths, it is preferred to have signal paths are placed between a Vdd return path and a Vss return path. Thus, every certain number of signal paths (e.g., every three signal paths), there is a Vdd return path or a Vss return path in between. It would be appreciated that Vdd and Vss paths are placed alternately between the signal paths.

In addition, an AC capacitance device 1306 is placed on each driver driving a signal through a signal path. The AC capacitance device 1306 is coupled to both Vdd and Vss return paths. When a signal such as signal 1302 switches from one state to another, as described above, the AC capacitance device 1306 enables a driver, such as driver 1305, to receive returning signal from both return paths 1301 and 1303. In one embodiment, the AC capacitance device includes a capacitor. The AC capacitance device may have a value of 100 pF. As a result, the loop inductance may be reduced.

Furthermore, the bond wires connecting from die pads 1313 of a die to bond pads 1314 of a BGA substrate may be construed such that some bond wires are wired above other bond wires. For example, bond wires 1304 are construed above the other bond wires, such as bond wires 1312. As a result, the signal paths are mixed with return paths in a three dimensional pattern. Therefore the loop inductance may be further reduced. In one embodiment, the electrical conductive contacts, such as die pads 1313 and bond pads 1314, are disposed in at least two rows. Alternatively, multiple rows may be disposed. In addition, in one embodiment, the bond wires 1304 and 1312, which connect the die pads 1313 and the bond pads 1314, may be construed in multiple heights.

Figure 14:
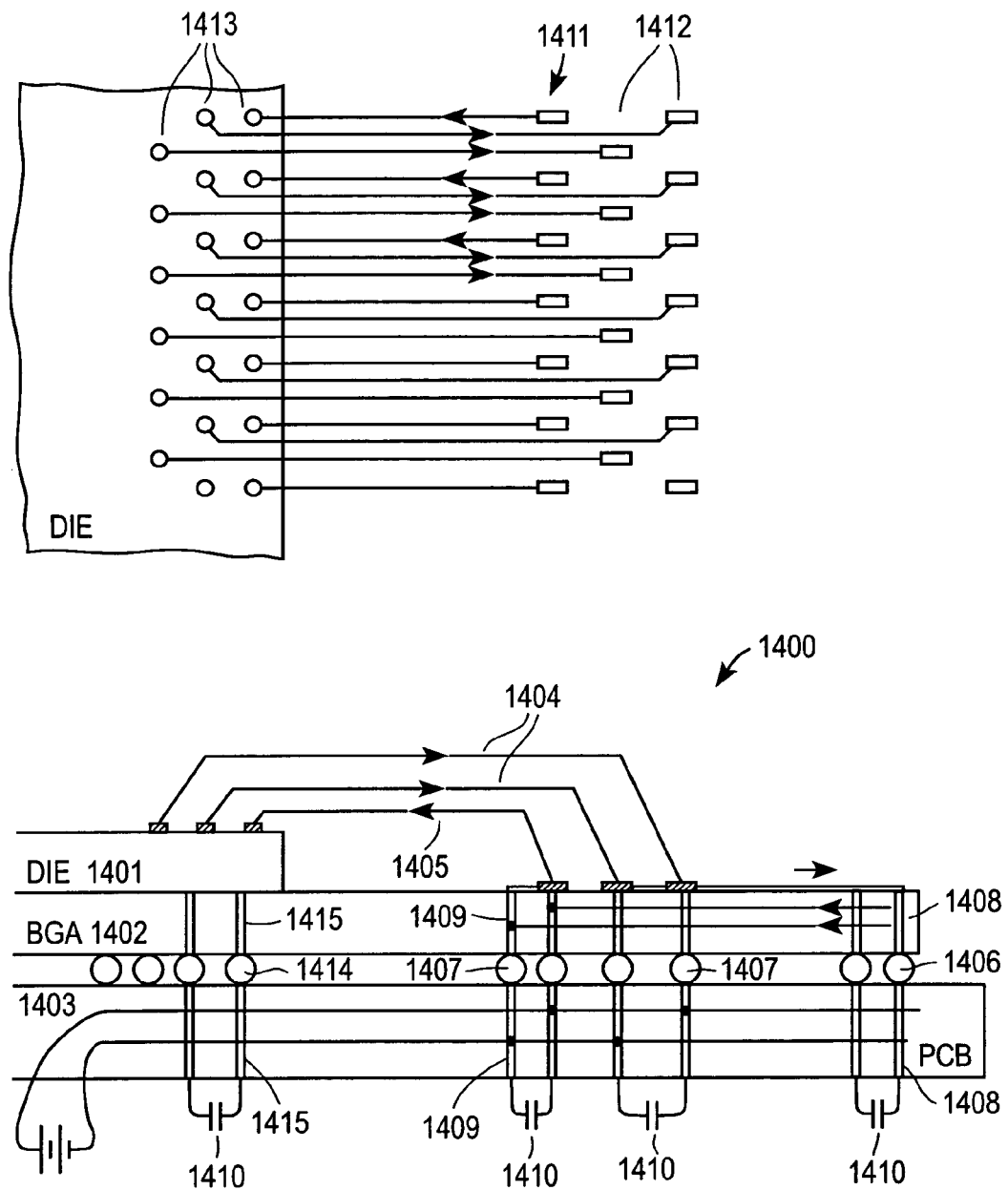
FIG. 14 illustrates yet another alternative embodiment of the invention.

FIG. 14 illustrates another alternative embodiment of the invention. In this embodiment, multiple rows of die pads 1413 and multiple rows of bond pads 1411 and 1412 are used for high density bond wiring on a semiconductor chip. In one embodiment, the signal paths are mixed with return paths, for example, a return path is placed between every certain number of signal paths, as described above. In an alternative embodiment, a row of bond pads, such as row 1411 may be used for hybrid signals. Hybrid signals may include signals, power and ground. The other rows such as row 1412 may be used for data signals. In a further alternative embodiment, row 1411 may be used for return paths, including Vdd and Vss return paths.

In addition, signal paths may be wired over the return paths. For example, signal paths 1404 may be wired above the return paths 1405. As a result, the mixed pattern of signal and return paths are construed in a three dimensional pattern. In an alternative embodiment, return paths may be wired over the signal paths, such that the return paths may be used to shield the signal paths from extra interference from noise. It would be appreciated that multiple heights of bond wires may be construed wherein signal and return paths are mixed in vertical orientation, as well as in horizontal orientation. As a result, a 3D structure having multiple levels of mixed signal and return paths is formed.

Furthermore, additional balls 1407 and vias 1409 are placed in the conventional free balls zone, between the core balls, such as balls 1414, and the perimeter balls, such as balls 1406. It is preferred to have balls 1407 and vias 1409 placed near the bond pads 1411 and 1412. In one embodiment the vias 1409 are placed right next to the bond pads. The balls 1407 and vias 1409 enable the connection from the bond pads to access to other components on the other side of the PCB such as by pass capacitor 1410. As a result, the connection contains a much shorter loop and the loop inductance may be reduced. A conventional method requires the connection either goes through the core balls 1414 or the perimeter balls 1406, which has a longer loop and higher loop inductance. In one embodiment, the electrical conductive contacts, such as die pads 1413 and bond pads 1411 and 1412, are disposed in at least two rows. Alternatively, multiple rows may be disposed. In addition, in one embodiment, the bond wires 1404 and 1405 may be construed in multiple heights.

Figure 15A:
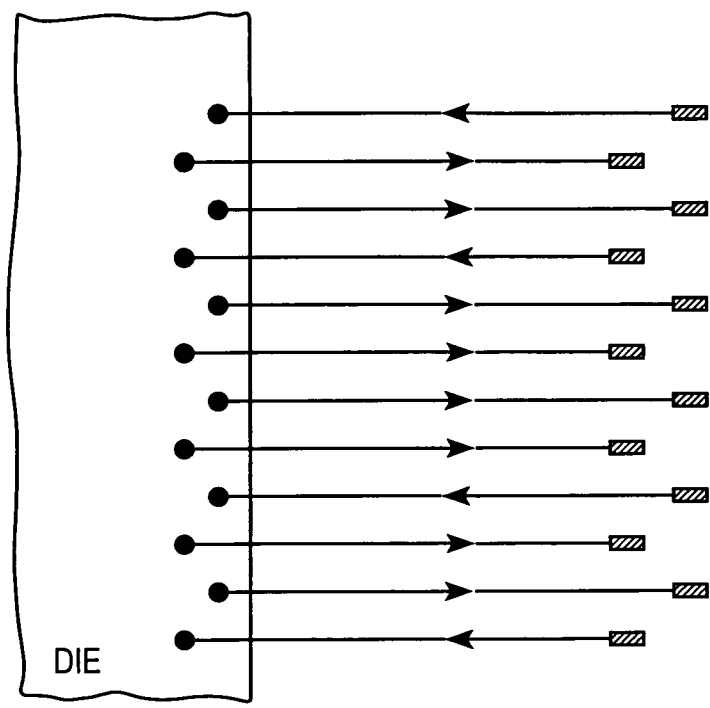
FIG. 15A illustrates yet another alternative embodiment of the invention.

FIG. 15A shows another alternative embodiment of the invention. The package in FIG. 15A includes a mixed pattern of signal paths and return paths, similar to one in FIG. 6. In addition, extra balls 1504 and vias 1505 are placed in the conventional free balls zone to provide shorter loop to access to other components, such as capacitor 1506, on the other side of the PCB. Furthermore, the bond wires may be construed mixing signal and return paths in a three dimensional pattern, which may further reduce the loop inductance. In one embodiment, the electrical conductive contacts, such as die pads disposed on the die and bond pads disposed on the BGA substrate, are disposed in at least two rows. Alternatively, multiple rows may be disposed. In addition, in one embodiment, the bond wires connecting the die pads and the bond pads may be construed in multiple heights.

FIG. 15B shows yet another alternative embodiment of the invention. The package illustrated in FIG. 15B includes a mixed pattern of signal paths and return paths in a three dimensional (3D) structure. For example, a signal path 1512 runs from a die pad area 1513 of the die 1501 to the bond attachment area 1514 of the BGA substrate 1502. A return path 1511 goes in an opposite direction from bond attachment area 1514 to the die pad area 1513 of the die 1501. The signal path 1512 and the return path 1511 are arranged in adjacent to each other in a horizontal orientation. As a result, the loop inductance generated from the loop of signal path 1512 and the return path 1511 will be reduced by the mutual inductance between the signal path 1512 and the return path 1511.

In addition, the loop inductance may be further reduced by the mutual inductance between the signal path 1512 and another return path 1510 in a vertical orientation. The 3D structure will greatly reduce the over all loop inductance of the circuits. It would be appreciated that these 3D structures are construed through out the electronic package. It would be further appreciated that these 3D structures are also applied to the multiple layers of signal path and return path, as well as power and ground planes embedded inside the BGA substrate 1502 and PCB 1503 (not shown), to further reduce the loop inductance of the circuitries in those area.

Furthermore, a grid of electrically conductive balls, such as balls 1504, is placed between the perimeter of the device attachment area (e.g., the perimeter of the die 1501), and the bond attachment area (e.g., bond pad area 1514) of the BGA substrate 1502. Alternatively, the electrically conductive balls, such as ball 1515, may be placed between the bond attachment area and the conventional I/O ball (e.g., ball 1508) area. These balls 1504 are used to connect to a capacitor disposed on the bottom surface of the PCB 1503 through a grid of vias 1505. The capacitor 1506 may be a surface mount capacitor. The ball 1504, capacitor 1506, as well as vias 1505 constitute short loop which induce a minimum loop inductance when the signal switches. Similarly, the capacitor 1507, ball 1508, and vias 1509 also have the same effect to reduce the loop inductance. In one embodiment, the electrical conductive contacts, such as die pads in the die pad area 1513 and bond pads in bond pad area 1514, are disposed in at least two rows. Alternatively, multiple rows may be disposed.

Figure 15A:
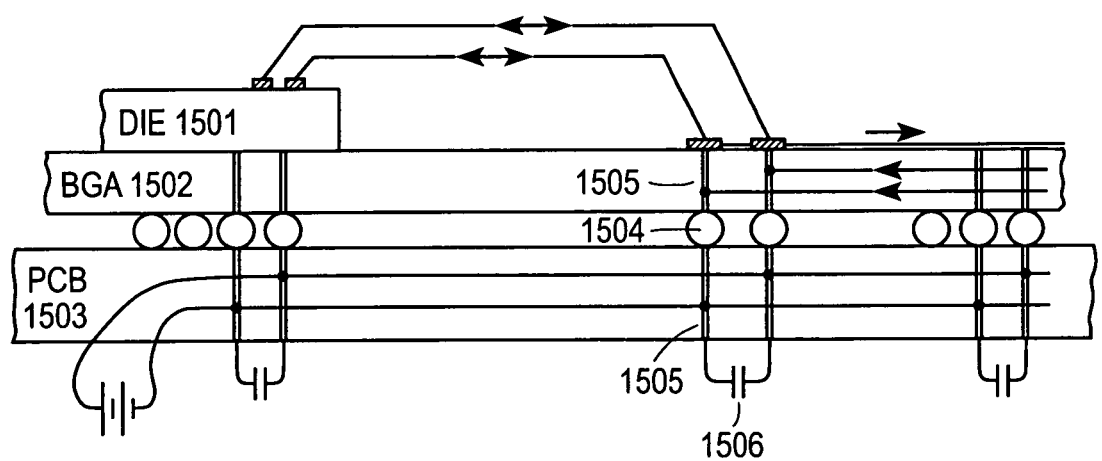
Figure 16:
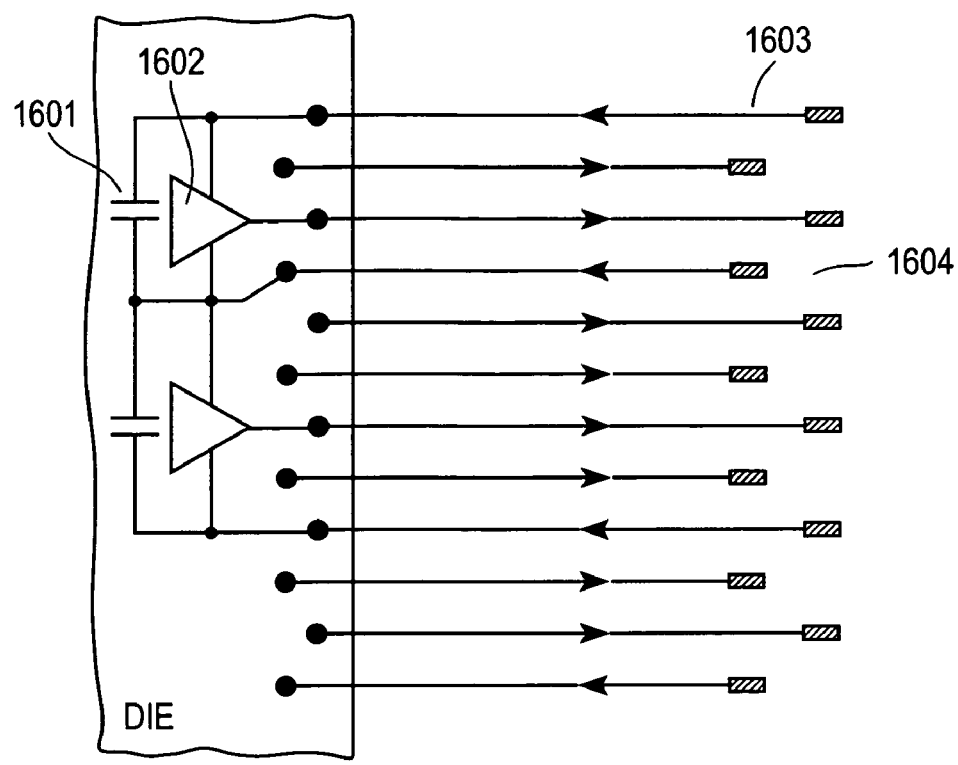
FIG. 16 illustrates yet another alternative embodiment of the invention.
Figure 16:
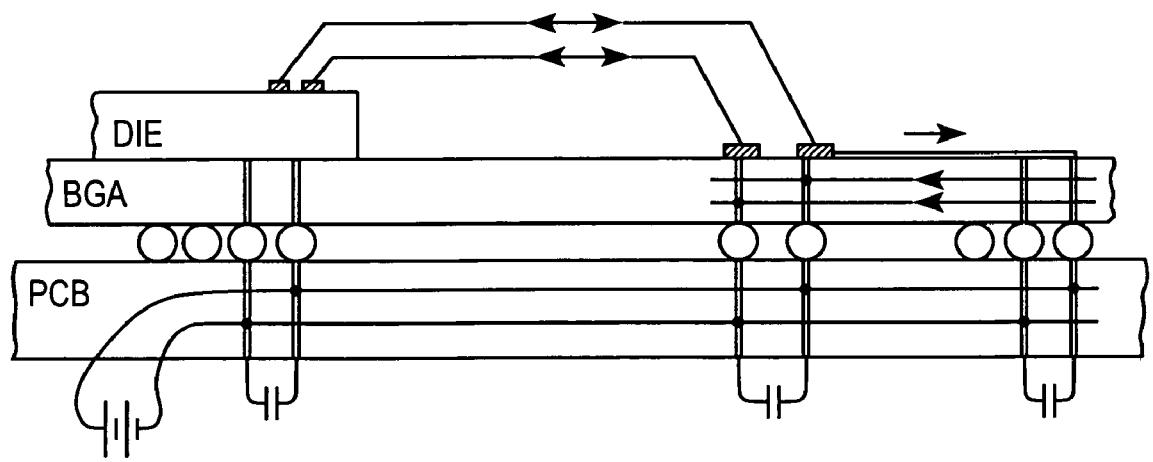

FIG. 16 shows yet another alternative embodiment of the invention. In addition to FIG. 15, an AC capacitance device 1601 is placed on a driver 1602 driving a signal through a signal path. When the signal switches from one state to another, the AC capacitance device 1601 enables the driver 1602 to receive a returning signal from both return paths 1603 and 1604. In one embodiment, the AC capacitance device includes a capacitor. The AC capacitance device may have a value of 100 pF. As a result, the loop inductance may be further reduced. In one embodiment, the electrical conductive contacts, such as die pads disposed on the die and bond pads disposed on the BGA substrate, are disposed in at least two rows. Alternatively, multiple rows may be disposed. In addition, in one embodiment, the bond wires connecting the die pads and the bond pads may be construed in multiple heights.

Figure 17:
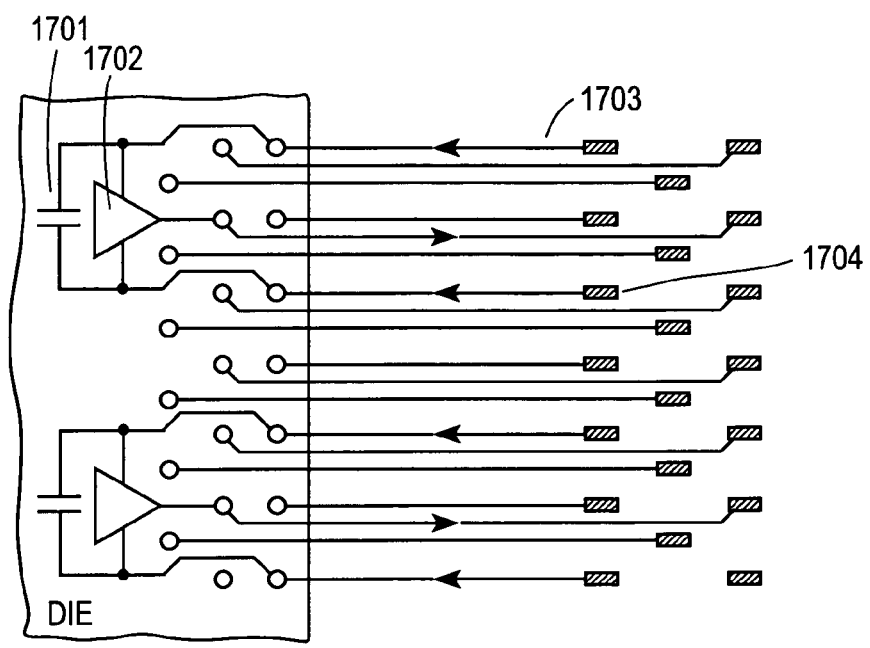
FIG. 17 illustrates yet another alternative embodiment of the invention.
Figure 17:
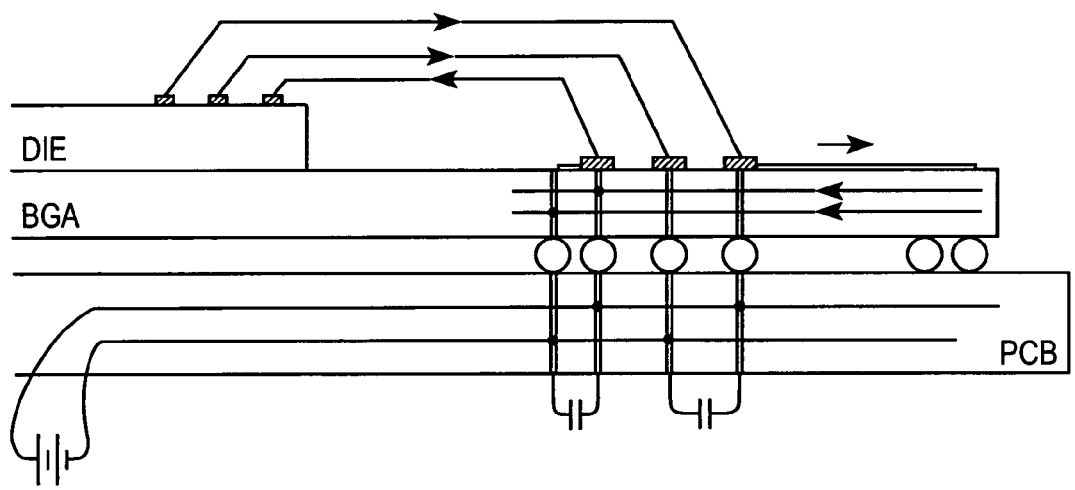

FIG. 17 shows yet another alternative embodiment of the invention. In addition to the structure of FIG. 14, an AC capacitance device 1701 is placed on a driver 1702 driving a signal through a signal path. When the signal switches from one state to another, the AC capacitance device 1701 enables the driver 1702 to receive a returning signal from both return paths 1703 and 1704. As a result, the loop inductance may be further reduced. In one embodiment, the electrical conductive contacts, such as die pads disposed on the die and bond pads disposed on the BGA substrate, are disposed in at least two rows. Alternatively, multiple rows may be disposed. In addition, in one embodiment, the bond wires connecting the die pads and the bond pads may be construed in multiple heights.

Figure 18A:
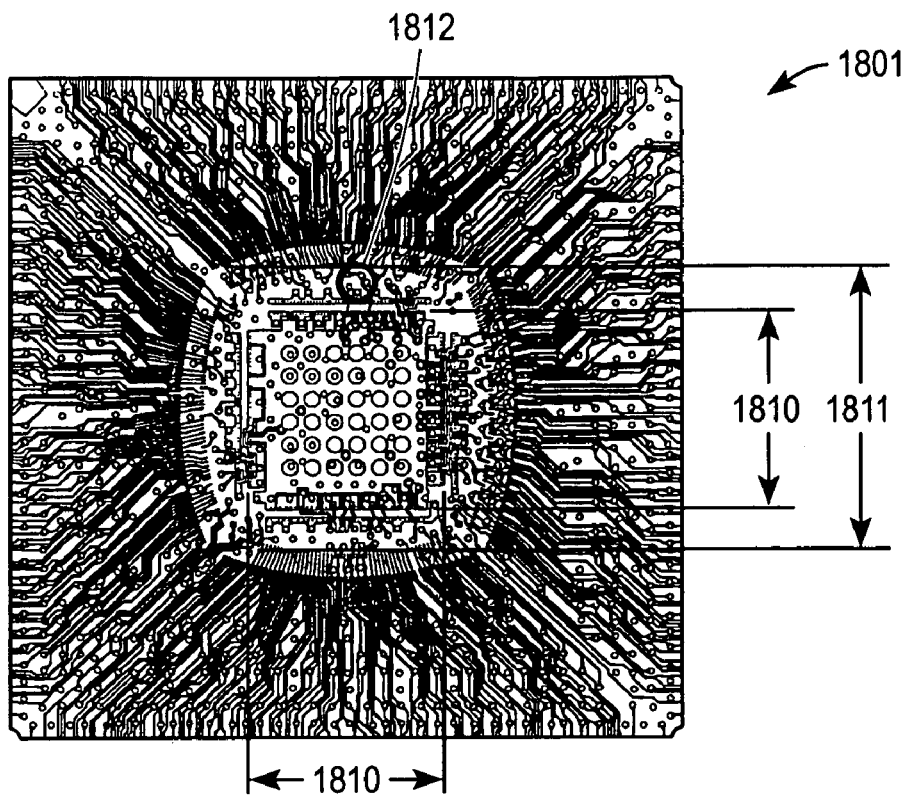
FIGS. 18A–18E illustrate a preferred embodiment of the invention.
Figure 18B:
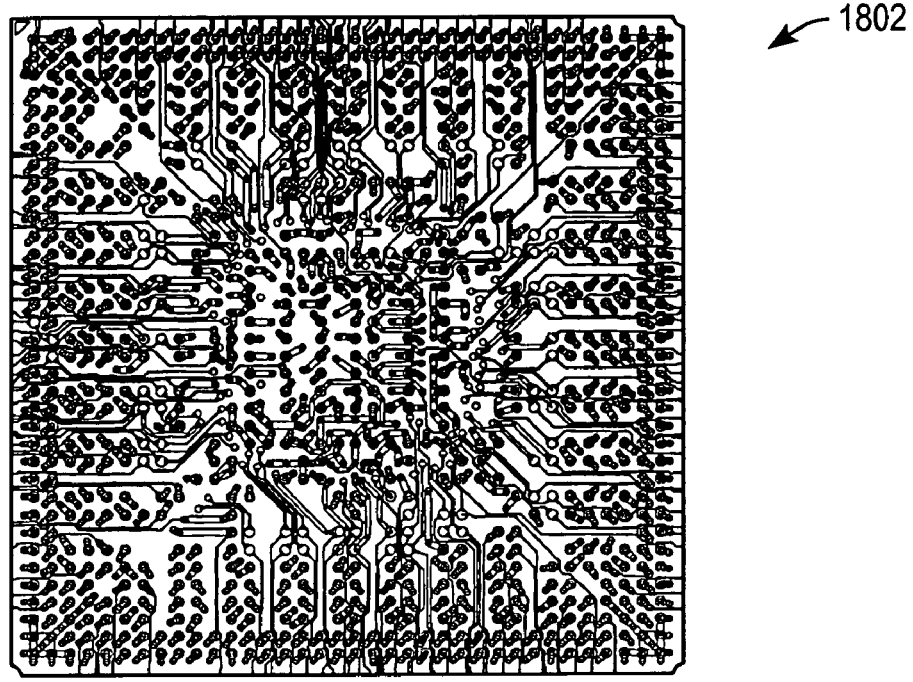
Figure 18C:
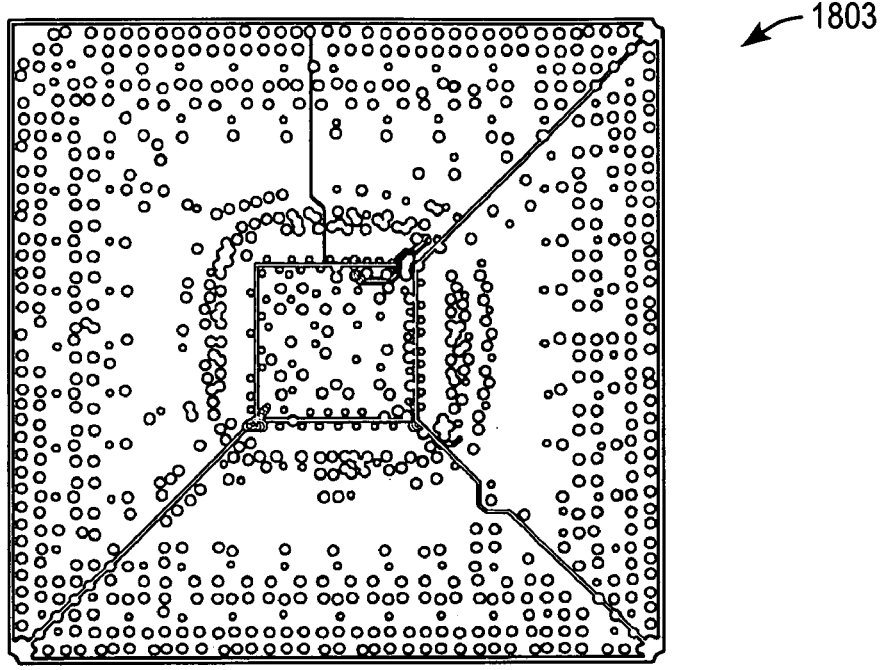
Figure 18D:
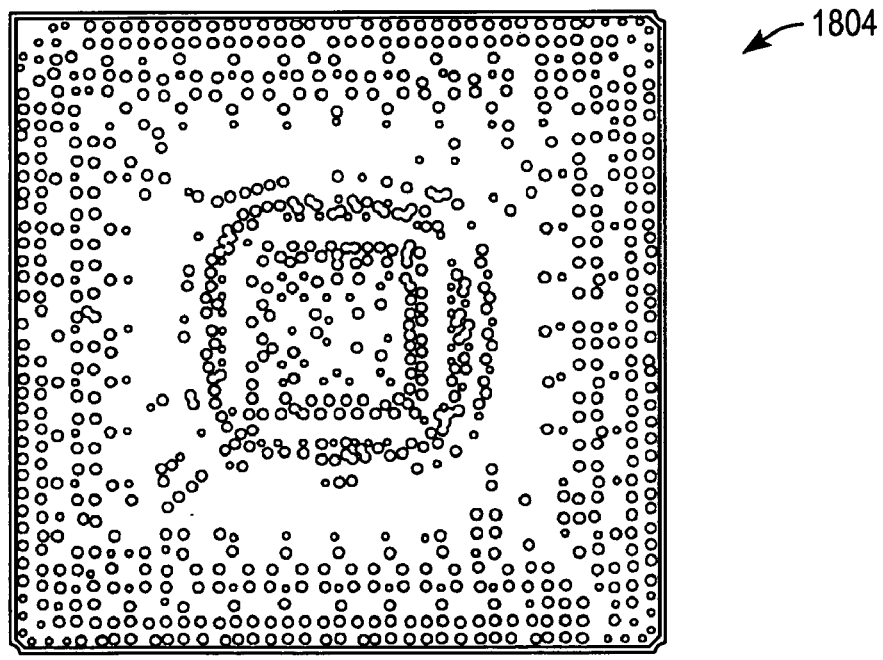
Figure 18E:
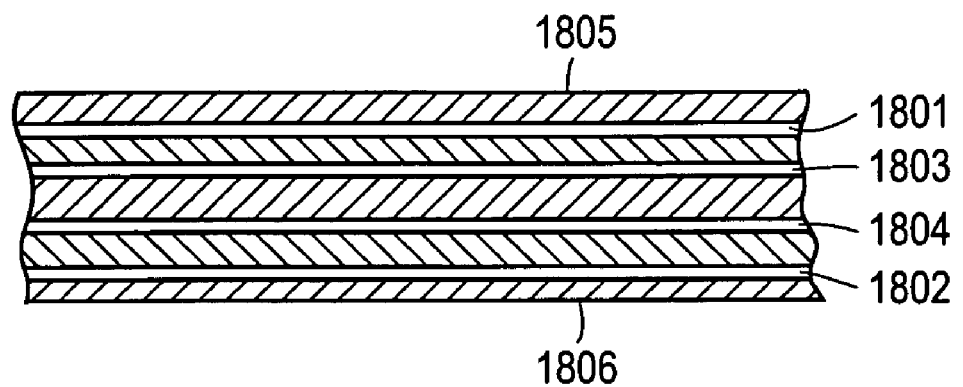
Figure 18E:
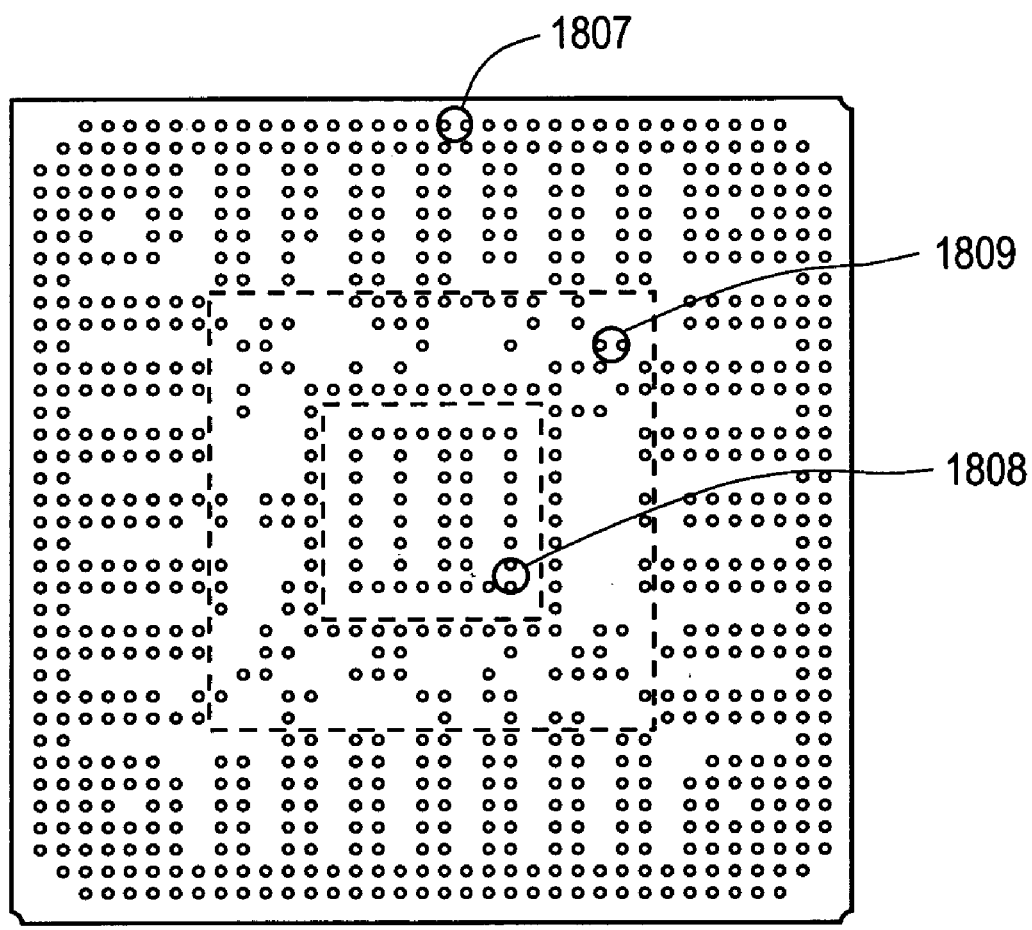

FIG. 18A shows a top signal layer of a preferred embodiment of the invention. FIG. 18B shows a bottom signal layer of a preferred embodiment of the invention. As described in FIG. 18A, extra vias 1812 are placed between the die 1810 and the bond attachment area (e.g., bonding wedges) 1811, which is considered as free balls zone in a conventional design. FIGS. 18C and 18D show a ground layer 1803 and a power layer 1804 respectively. Ground layer 1803 and power layer 1804 are construed as ground plane and power plane. Thus, signal paths are placed on either top signal layer 1801 or the bottom signal layer 1802. The return paths are placed on the ground plane 1803 and the power plane 1804. In one embodiment, Vdd return paths are carried on plane 1804 and Vss return paths are carried on plane 1803. The return paths are connected to a die through vias connecting the top layer and the return paths planes. In one embodiment, the return paths may be connected to the die through vias 1812 disposed between the die 1810 and the bond wedges 1811. FIG. 18E shows a bottom view of a preferred embodiment. As described in FIG. 18E, extra balls 1809 are placed between the conventional perimeter balls 1807 and the core balls 1808 to reduce the loop inductance.

Figure 19A:
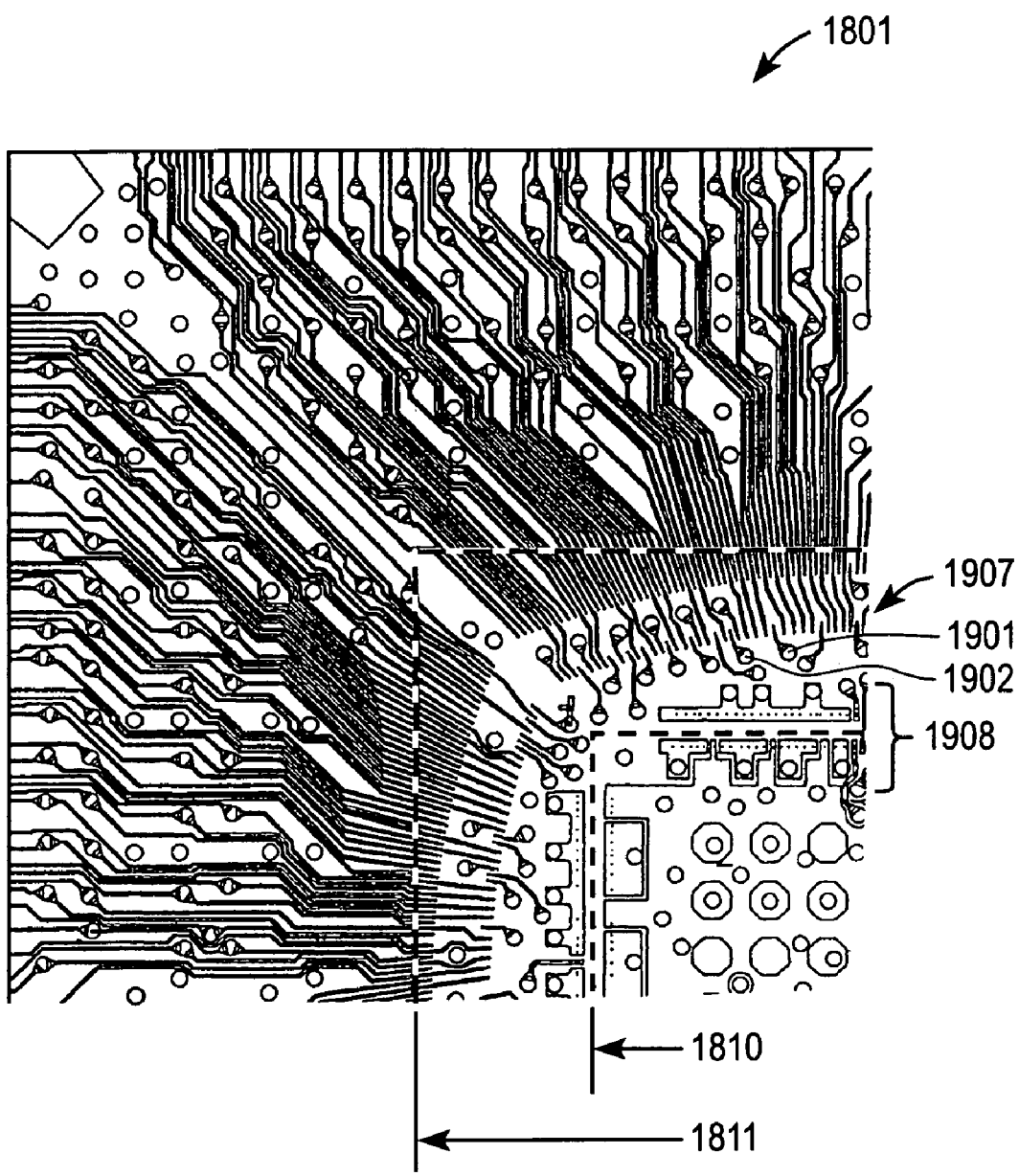
FIGS. 19A and 19B illustrate an enlarged version of FIGS. 18A–18E.
Figure 19B:
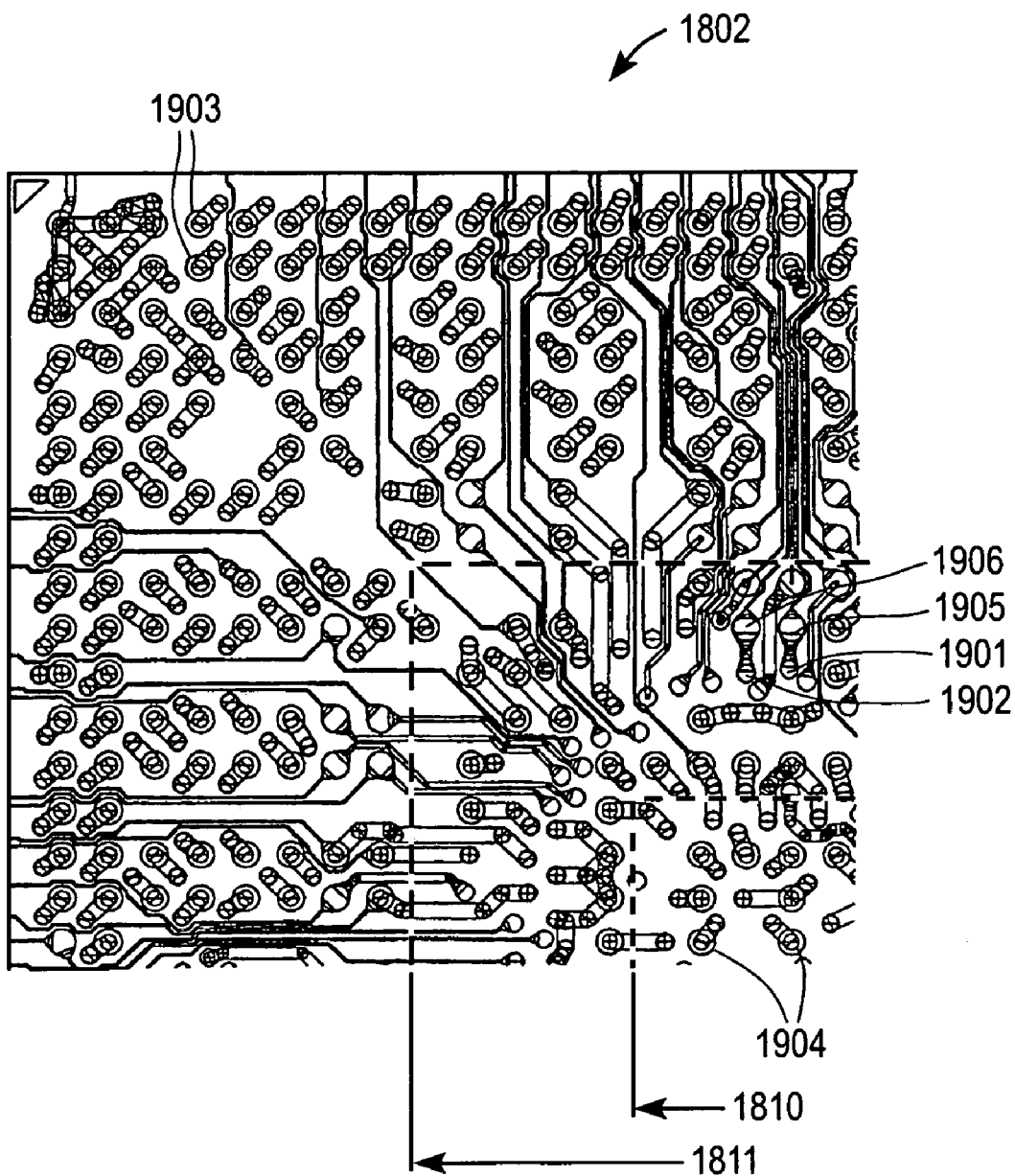

FIG. 19A shows an enlarged version of FIG. 18A and FIG. 19B shows an enlarged version of FIG. 18B. Referring to FIGS. 19A and 19B, addition to conventional core balls 1904 and perimeter balls 1903, extra balls 1905 and 1906 are placed between the die 1810 and the bond wedges 1811. Vias 1901 and 1902 connect the bond pads 1907 of the top signal layer 1801 to the balls 1905 and 1906 of the bottom signal layer 1802. The bond pads 1907 may be connected to other components on the other side of a PCB (not shown), through balls 1905 and 1906, and vias 1901 and 1902. As a result, shorter loop is used and the loop inductance may be reduced.

In addition, balls in the region between die 1810 and bond wedges 1811 may have different density, such as a depopulated area to allow more vias to be placed. The general rule is to place opposite polarity vias as close together as possible to have a tight loop, which reduces the loop inductance. Further detailed information concerning depopulation of a BGA substrate to allow via placement can be found in the U.S. co-pending application Ser. No. 09/678,542, filed Oct. 2, 2000 and entitled *Depopulation of a Ball Grid Array to Allow Via Placement*, by William P. Cornelius, et al., which application is hereby incorporated by reference.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic package, comprising:
    a multi-layer substrate having a top surface and a bottom surface;
    a device attachment area disposed centrally on the top surface;
    a plurality of bond attachment areas disposed peripherally around the device attachment area on the top surface, the bond attachment areas including a plurality of the electrically conductive contacts receiving bond wires from an integrated circuit (IC) device attached to the device attachment area, the plurality of electrically conductive contacts being disposed in at least two rows;
    a plurality of first return paths formed through some of the plurality of electrically conductive contacts;
    a plurality of signal paths formed through some of the plurality of electrically conductive contacts; and
    a plurality of second return paths formed through some of the plurality of electrically conductive contacts,
    wherein at least one of the plurality of first return paths are placed between every predetermined number of the plurality of the signal paths, and
    wherein at least one of the plurality of second return paths are placed between every predetermined number of the plurality of the signal paths.

2. The electronic package of claim 1, wherein the first row includes signal paths, first return paths and second return paths, and wherein the second row includes signal paths.

3. The electronic package of claim 1, wherein the at least two rows comprise a first row and a second row, wherein the IC device further comprises:
    first bond wires attached to the electrically conductive contacts of the first row, the first bond wires being wired to the IC device attached to the bond attachment areas of the top surface;
    second bond wires attached to the electrically conductive contacts of the second row, the second bond wires being wired to the IC device attached the bond attachment areas of the top surface; and
    wherein the first bond wires are wired above the second bond wires, without electrically connecting.

4. The electronic package of claim 1, further comprising:
an outer ball region disposed peripherally along perimeter of the bottom surface, the outer ball region having a plurality of outer balls;
a grid of electrically conductive balls disposed on the bottom surface, between the perimeter of the device attachment area and the outer ball region;
a first grid of electrically conductive vias disposed between the perimeter of the device attachment area and the outer ball region, the first grid of electrically conductive vias connecting the top and bottom surfaces through the substrate; and
a plurality of electrically conductive traces for forming electrical interconnections between the balls, the vias, and the electrically conductive contacts of the bond attachment areas.

5. The electronic package of claim 4, further comprising:
a circuit board having a top surface and a bottom surface, the substrate being disposed on the top surface of the circuit board through the grid of electrical conductive balls disposed on the bottom surface of the substrate;
a second grid of electrically conductive vias disposed through the circuit board to connect the top and bottom surfaces of the circuit board; and
one or more capacitors disposed on the bottom surface of the circuit board, the one or more capacitors coupling one or more vias of the circuit board.

6. The electronic package of claim 4, wherein the grid of electrically conductive balls are disposed at a first pitch one from the other, the grid of electrically conductive balls having at least one depopulated region therein, and wherein the first grid of electrically conductive vias are disposed within the depopulated region at a second pitch one from the other.

7. An electronic package, comprising:
a multi-layer substrate having a top surface and a bottom surface;
a device attachment area disposed centrally on the top surface;
a plurality of bond attachment areas disposed peripherally around the device attachment area on the top surface, the bond attachment areas including a plurality of the electrically conductive contacts receiving bond wires from an integrated circuit (IC) device attached to the device attachment area, the plurality of electrically conductive contacts being disposed in at least two rows;
a plurality of first return paths formed through some of the plurality of electrically conductive contacts;
a plurality of signal paths formed through some of the plurality of electrically conductive contacts, and
wherein at least one of the plurality of first return paths are placed between every three signal paths.

8. An electronic package, comprising:
a multi-layer substrate having a top surface and a bottom surface;
a device attachment area disposed centrally on the top surface;
an integrated circuit (IC) device attached to the device attachment area on the top surface, the IC device comprising:
a plurality of first electrically conductive contacts disposed on a surface of the IC device;
a plurality of first return paths formed through some of the plurality of first electrically conductive contacts;
a plurality of signal paths formed through some of the plurality of first electrically conductive contacts; and
wherein at least one of the plurality of first return paths are placed between every predetermined number of the plurality of the signal paths;
a plurality of bond attachment areas disposed peripherally around the device attachment area on the top surface, the bond attachment areas including a plurality of second electrically conductive contacts receiving bond wires attached to the plurality of the first electrically conductive contacts of the IC device attached to the device attachment area;
an outer ball region disposed peripherally along perimeter of the bottom surface, the outer ball region having a plurality of outer balls;
a grid of electrically conductive balls disposed on the bottom surface, between the perimeter of the device attachment area and the outer ball region;
a first grid of electrically conductive vias disposed between the perimeter of the device attachment area and the outer ball region, the first grid of electrically conductive vias connecting the top and bottom surfaces through the substrate; and
a plurality of electrically conductive traces for forming electrical interconnections between the balls, the vias, and the second electrically conductive contacts of the bond attachment areas;
a plurality of second return paths formed through some of the first plurality of electrically conductive contacts on the IC device,
wherein at least one of the plurality of second return paths are placed between every predetermined number of the plurality of the signal paths.

9. The electronic package of claim 8, wherein at least one of the plurality of signal paths are placed between one of the plurality of first return paths and one of the plurality of second return paths.

10. The electronic package of claim 8, wherein predetermined number of the plurality of signal paths are placed between one of the plurality of first return paths and one of the plurality of second return paths.

11. The electronic package of claim 8, wherein the plurality of first electrically conductive contacts are disposed in at least two rows.

12. The electronic package of claim 11, wherein the first row includes signal paths, first return paths and second return paths, and wherein the second row includes signal paths.

13. The electronic package of claim 11, wherein the at least two rows comprise a first row and a second row, wherein the electronic package further comprises:
first bond wires attached to the electrically conductive contacts of the first row, the first bond wires being wired to the bond attachment areas of the substrate;
second bond wires attached to the electrically conductive contacts of the second row, the second bond wires being wired to the bond attachment areas of the substrate; and
wherein the first bond wires are wired above, the second bond wires, without electrically connecting.

14. The electronic package of claim 8, further comprising:
a plurality of drivers for driving signals through the plurality of signal paths, the plurality of drivers receiving returning signals through the plurality of first return paths or the plurality of second return paths;
a plurality of alternating current (AC) capacitance devices, each of the plurality of AC capacitance devices coupled to one of the plurality of first return paths and coupled to one of the plurality of second return paths, on each of the plurality of drivers; and wherein each of the plurality of AC capacitance devices enables each of the plurality of drivers to receive a returning signal from one of the plurality of first return path and one of the plurality of second return paths.

15. The electronic package of claim 14, wherein the AC capacitance devices including capacitors.

16. The electronic package of claim 8, further comprising:
a circuit board having a top surface and a bottom surface, the substrate being disposed on the top surface of the circuit board through the grid of electrical conductive balls disposed on the bottom surface of the substrate;
a second grid of electrically conductive vias disposed through the circuit board to connect the top and bottom surfaces of the circuit board; and
one or more capacitors disposed on the bottom surface of the circuit board, the one or more capacitors coupling one or more vias of the circuit board.

17. The electronic package of claim 8, wherein the grid of electrically conductive balls are disposed at a first pitch one from the other, the grid of electrically conductive balls having at least one depopulated region therein, and wherein the first grid of electrically conductive vias are disposed within the depopulated region at a second pitch one from the other.

18. An electronic package, comprising:
a multi-layer substrate having a top surface and a bottom surface;
a device attachment area disposed centrally on the top surface;
an integrated circuit (IC) device attached to the device attachment area on the top surface, the IC device comprising:
  a plurality of first electrically conductive contacts disposed on a surface of the IC device;
  a plurality of first return paths formed through some of the plurality of first electrically conductive contacts;
  a plurality of signal paths formed through some of the plurality of first electrically conductive contacts; and
  wherein at least one of the plurality of first return paths are placed between every predetermined number of the plurality of the signal paths;
a plurality of bond attachment areas disposed peripherally around the device attachment area on the top surface, the bond attachment areas including a plurality of second electrically conductive contacts receiving bond wires attached to the plurality of the first electrically conductive contacts of the IC device attached to the device attachment area;
an outer ball region disposed peripherally along perimeter of the bottom surface, the outer ball region having a plurality of outer balls;
a grid of electrically conductive balls disposed on the bottom surface, between the perimeter of the device attachment area and the outer ball region;
a first grid of electrically conductive vias disposed between the perimeter of the device attachment area and the outer ball region, the first grid of electrically conductive vias connecting the top and bottom surfaces through the substrate; and
a plurality of electrically conductive traces for forming electrical interconnections between the balls, the vias, and the second electrically conductive contacts of the bond attachment areas,
wherein the predetermined number of the plurality of the signal paths comprises three signal paths.

19. A method, comprising:
providing a multi-layer substrate having a top surface and a bottom surface;
forming a device attachment area disposed centrally on the top surface;
forming a plurality of bond attachment areas disposed peripherally around the device attachment area on the top surface, the bond attachment areas including a plurality of the electrically conductive contacts receiving bond wires from an integrated circuit (IC) device attached to the device attachment area;
forming a plurality of first return paths formed through some of the plurality of electrically conductive contacts;
forming a plurality of signal paths formed through some of the plurality of electrically conductive contacts, wherein at least one of the plurality of first return paths are placed between every predetermined number of the plurality of the signal paths; and
forming a plurality of second return paths formed through some of the plurality of electrically conductive contacts,
wherein at least one of the plurality of second return paths are placed between every predetermined number of the plurality of the signal paths.

20. The method of claim 19, wherein at least one of the plurality of signal paths are placed between one of the plurality of first return paths and one of the plurality of second return paths.

21. The method of claim 19, wherein predetermined number of the plurality of signal paths are placed between one of the plurality of first return paths and one of the plurality of second return paths.

22. A method, comprising:
providing a multi-layer substrate having a top surface and a bottom surface;
forming a device attachment area disposed centrally on the top surface;
providing an integrated circuit (IC) device attached to the device attachment area on the top surface, the IC device comprising:
  a plurality of first electrically conductive contacts disposed on a surface of the IC device;
  a plurality of first return paths formed through some of the plurality of first electrically conductive contacts;
  a plurality of signal paths formed through some of the plurality of first electrically conductive contacts; and
  wherein at least one of the plurality of first return paths are placed between every predetermined number of the plurality of the signal paths;
forming a plurality of bond attachment areas disposed peripherally around the device attachment area on the top surface, the bond attachment areas including a plurality of second electrically conductive contacts receiving bond wires attached to the plurality of the first electrically conductive contacts of the IC device attached to the device attachment area;
forming an outer ball region disposed peripherally along perimeter of the bottom surface, the outer ball region having a plurality of outer balls;
forming a grid of electrically conductive balls disposed on the bottom surface, between the perimeter of the device attachment area and the outer ball region;
forming a first grid of electrically conductive vias disposed between the perimeter of the device attachment area and the outer ball region, the first grid of electrically conductive vias connecting the top and bottom surfaces through the substrate; and forming electrical interconnections between the balls, the vias, and the second electrically conductive contacts of the bond attachment areas, through a plurality of electrically conductive traces; and forming a plurality of second return paths formed through some of the first plurality of electrically conductive contacts on the IC device, wherein at least one of the plurality of second return paths are placed between every predetermined number of the plurality of the signal paths.

23. The method of claim 22, wherein at least one of the plurality of signal paths are placed between one of the plurality of first return paths and one of the plurality of second return paths.

24. The method of claim 22, wherein predetermined number of the plurality of signal paths are placed between one of the plurality of first return paths and one of the plurality of second return paths.

25. The method of claim 22, further comprising:

forming a plurality of drivers for driving signals through the plurality of signal paths, the plurality of drivers receiving returning signals through the plurality of first return paths or the plurality of second return paths;

providing a plurality of alternating current (AC) capacitance devices, each of the plurality of AC capacitance devices coupled to one of the plurality of first return paths and coupled to one of the plurality of second return paths, on each of the plurality of drivers; and wherein each of the plurality of AC capacitance devices enables each of the plurality of drivers to receive a returning signal from one of the plurality of first return path and one of the plurality of second return paths.

26. The method of claim 25, wherein the AC capacitance devices comprise capacitors.

27. The method of claim 22, further comprising:

providing a circuit board having a top surface and a bottom surface, the substrate being disposed on the top surface of the circuit board through the grid of electrical conductive balls disposed on the bottom surface of the substrate;

forming a second grid of electrically conductive vias disposed through the circuit board to connect the top and bottom surfaces of the circuit board; and providing one or more capacitors disposed on the bottom surface of the circuit board, the one or more capacitors coupling one or more vias of the circuit board.

28. The method of claim 22, wherein the grid of electrically conductive balls are disposed at a first pitch one from the other, the grid of electrically conductive balls having at least one depopulated region therein, and wherein the first grid of electrically conductive vias are disposed within the depopulated region at a second pitch one from the other.

29. A method, comprising:

providing a multi-layer substrate having a top surface and a bottom surface;

forming a device attachment area disposed centrally on the top surface;

providing an integrated circuit (IC) device attached to the device attachment area on the top surface, the IC device comprising:

a plurality of first electrically conductive contacts disposed on a surface of the IC device;

a plurality of first return paths formed through some of the plurality of first electrically conductive contacts;

a plurality of signal paths formed through some of the plurality of first electrically conductive contacts; and wherein at least one of the plurality of first return paths are placed between every predetermined number of the plurality of the signal paths;

forming a plurality of bond attachment areas disposed peripherally around the device attachment area on the top surface, the bond attachment areas including a plurality of second electrically conductive contacts receiving bond wires attached to the plurality of the first electrically conductive contacts of the IC device attached to the device attachment area;

forming an outer ball region disposed peripherally along perimeter of the bottom surface, the outer ball region having a plurality of outer balls;

forming a grid of electrically conductive balls disposed on the bottom surface, between the perimeter of the device attachment area and the outer ball region;

forming a first grid of electrically conductive vias disposed between the perimeter of the device attachment area and the outer ball region, the first grid of electrically conductive vias connecting the top and bottom surfaces through the substrate; and forming electrical interconnections between the balls, the vias, and the second electrically conductive contacts of the bond attachment areas, through a plurality of electrically conductive traces, wherein the predetermined number of the plurality of the signal paths comprises three signal paths.

30. An apparatus, comprising:

means for providing a multi-layer substrate having a top surface and a bottom surface;

means for forming a device attachment area disposed centrally on the top surface;

means for forming a plurality of bond attachment areas disposed peripherally around the device attachment area on the top surface, the bond attachment areas including a plurality of the electrically conductive contacts receiving bond wires from an integrated circuit (IC) device attached to the device attachment area;

means for forming a plurality of first return paths formed through some of the plurality of electrically conductive contacts;

means for forming a plurality of signal paths formed through some of the plurality of electrically conductive contacts, wherein at least one of the plurality of first return paths are placed between every predetermined number of the plurality of the signal paths; and means for forming a plurality of second return paths formed through some of the plurality of electrically conductive contacts, wherein at least one of the plurality of second return paths are placed between every predetermined number of the plurality of the signal paths.

31. An apparatus, comprising:

means for providing a multi-layer substrate having a top surface and a bottom surface;

means for forming a device attachment area disposed centrally on the top surface;

means for providing an integrated circuit (IC) device attached to the device attachment area on the top surface, the IC device comprising:

a plurality of first electrically conductive contacts disposed on a surface of the IC device;

a plurality of first return paths formed through some of the plurality of first electrically conductive contacts;

a plurality of signal paths formed through some of the plurality of first electrically conductive contacts; and wherein at least one of the plurality of first return paths are placed between every predetermined number of the plurality of the signal paths;

means for forming a plurality of bond attachment areas disposed peripherally around the device attachment area on the top surface, the bond attachment areas including a plurality of second electrically conductive contacts receiving bond wires attached to the plurality of the first electrically conductive contacts of the IC device attached to the device attachment area;

means for forming an outer ball region disposed peripherally along perimeter of the bottom surface, the outer ball region having a plurality of outer balls;

means for forming a grid of electrically conductive balls disposed on the bottom surface, between the perimeter of the device attachment area and the outer ball region;

means for forming a first grid of electrically conductive vias disposed between the perimeter of the device attachment area and the outer ball region, the first grid of electrically conductive vias connecting the top and bottom surfaces through the substrate; and means for forming electrical interconnections between the balls, the vias, and the second electrically conductive contacts of the bond attachment areas, through a plurality of electrically conductive traces; and means for forming a plurality of second return paths formed through some of the first plurality of electrically conductive contacts on the IC device, wherein at least one of the plurality of second return paths are placed between every predetermined number of the plurality of the signal paths.

32. The apparatus of claim 31, further comprising:

means for forming a plurality of drivers for driving signals through the plurality of signal paths, the plurality of drivers receiving returning signals through the plurality of first return paths or the plurality of second return paths;

means for providing a plurality of alternating current (AC) capacitance devices, each of the plurality of AC capacitance devices coupled to one of the plurality of first return paths and coupled to one of the plurality of second return paths, on each of the plurality of drivers; and wherein each of the plurality of AC capacitance devices enables each of the plurality of drivers to receive a returning signal from one of the plurality of first return path and one of the plurality of second return paths.

33. The apparatus of claim 31, further comprising:

means for providing a circuit board having a top surface and a bottom surface, the substrate being disposed on the top surface of the circuit board through the grid of electrical conductive balls disposed on the bottom surface of the substrate;

means for forming a second grid of electrically conductive vias disposed through the circuit board to connect the top and bottom surfaces of the circuit board; and means for providing one or more capacitors disposed on the bottom surface of the circuit board, the one or more capacitors coupling one or more vias of the circuit board.

\* \* \* \* \*